US012707742B2

(12) United States Patent
Kono et al.

(10) Patent No.: US 12,707,742 B2
(45) Date of Patent: Aug. 11, 2026

(54) SOLID-STATE IMAGING DEVICE

(71) Applicant: HAMAMATSU PHOTONICS K.K., Hamamatsu (JP)

(72) Inventors: Makoto Kono, Hamamatsu (JP); Yoshiyuki Suzuki, Hamamatsu (JP); Keiichi Ota, Hamamatsu (JP); Shinya Ito, Hamamatsu (JP); Ryo Takiguchi, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 876 days.

(21) Appl. No.: 17/915,217

(22) PCT Filed: Jan. 20, 2021

(86) PCT No.: PCT/JP2021/001819
§ 371 (c)(1),
(2) Date: Sep. 28, 2022

(87) PCT Pub. No.: WO2021/199597
PCT Pub. Date: Oct. 7, 2021

(65) Prior Publication Data

US 2023/0115175 A1 Apr. 13, 2023

(30) Foreign Application Priority Data

Apr. 3, 2020 (JP) ................................ 2020-067471

(51) Int. Cl.
*H10F 39/00* (2025.01)
*H10F 39/10* (2025.01)
*H10F 39/12* (2025.01)

(52) U.S. Cl.
CPC ......... *H10F 39/805* (2025.01); *H10F 39/103* (2025.01); *H10F 39/107* (2025.01);
(Continued)

(58) Field of Classification Search
CPC ...... H10F 30/21; H10F 39/103; H10F 39/107; H10F 39/12; H10F 39/8033; H10F 39/804; H10F 39/805; H10F 39/806
See application file for complete search history.

(56) References Cited

U.S. PATENT DOCUMENTS

2005/0067640 A1 3/2005 Ohkawa
2009/0286346 A1* 11/2009 Adkisson ............. H10F 39/806 257/E31.13
(Continued)

FOREIGN PATENT DOCUMENTS

CN 104364906 A 2/2015
CN 104508819 A 4/2015
(Continued)

OTHER PUBLICATIONS

International Preliminary Report on Patentability mailed Oct. 13, 2022 for PCT/JP2021/001819.
(Continued)

*Primary Examiner* — Matthew E Warren
(74) *Attorney, Agent, or Firm* — Faegre Drinker Biddle & Reath LLP

(57) ABSTRACT

A solid-state imaging device includes a semiconductor substrate having a main surface provided with a plurality of light sensitive regions and an insulating film provided on the main surface of the semiconductor substrate. A plurality of uneven portions are formed on a surface (main surface) on the side opposite to the main surface of the semiconductor substrate in the insulating film and a plurality of height differences of the uneven portions exist in the light sensitive region.

5 Claims, 31 Drawing Sheets

(52) U.S. Cl.
CPC ......... *H10F 39/12* (2025.01); *H10F 39/8033* (2025.01); *H10F 39/804* (2025.01); *H10F 39/806* (2025.01)

(56) References Cited

U.S. PATENT DOCUMENTS

| | | | | |
|---|---|---|---|---|
| 2013/0032914 | A1* | 2/2013 | Iwasaki | H10F 77/413 257/E31.127 |
| 2015/0303226 | A1* | 10/2015 | Kurihara | H10F 39/18 257/432 |
| 2017/0141151 | A1* | 5/2017 | Sato | H10F 39/024 |
| 2018/0324339 | A1 | 11/2018 | Masuda et al. | |
| 2020/0052023 | A1* | 2/2020 | Itabashi | H10F 39/802 |
| 2020/0301053 | A1* | 9/2020 | Wang | G02B 5/201 |

FOREIGN PATENT DOCUMENTS

| | | | | | |
|---|---|---|---|---|---|
| CN | 107078136 | A | | 8/2017 | |
| JP | H06-125068 | A | | 5/1994 | |
| JP | H09022995 | A | | 1/1997 | |
| JP | H10-144951 | A | | 5/1998 | |
| JP | 2006073885 | A | * | 3/2006 | H10F 77/413 |
| JP | 2006-173220 | A | | 6/2006 | |
| JP | 2007-281324 | A | | 10/2007 | |
| JP | 2009-246299 | A | | 10/2009 | |
| JP | 2010-002466 | A | | 1/2010 | |
| JP | 2010-080648 | A | | 4/2010 | |
| JP | 2010-232494 | A | | 10/2010 | |
| JP | 2011082399 | A | | 4/2011 | |
| JP | 2012-163785 | A | | 8/2012 | |
| JP | 2013065909 | A | | 4/2013 | |
| JP | 2013-093609 | A | | 5/2013 | |
| JP | 2014241351 | A | * | 12/2014 | |
| JP | 2019102623 | A | * | 6/2019 | |
| KR | 20080060573 | A | * | 7/2008 | H10F 39/8063 |
| WO | WO-2013/190864 | A1 | | 12/2013 | |
| WO | WO-2017150616 | A1 | * | 9/2017 | H10F 30/20 |
| WO | WO-2018012314 | A1 | * | 1/2018 | H04N 25/70 |
| WO | WO-2018/138851 | A1 | | 8/2018 | |
| WO | WO-2021/039955 | A1 | | 3/2021 | |

OTHER PUBLICATIONS

Junyeong Yun, et al., "All-solid-state flexible micro-supercapacitor arrays with patterned graphene/MWNT electrodes", Elsevier, Nov. 30, 2014, p. 156-p. 164.

Baogeng Xu, "Colour Camera Technology (serial 8)", Chapter 8: Colour solid-state cameras, Dec. 31, 1984, p. 46-p. 51.

* cited by examiner (a)

(b)

(c)

| INTERVAL OF PEAKS AND VALLEYS | 1.0μm | 3.0μm | 5.0μm |
|---|---|---|---|
| BEFORE HEAT TREAT-MENT | 32 31 32 31 30 20 | 31 32 31 32 31 30 20 | 31 32 31 30 20 |
| AFTER HEAT TREAT-MENT | 30 20 | 32 31 32 31 32 31 32 30 20 | 32 31 32 31 32 30 20 |

SOLID-STATE IMAGING DEVICE

TECHNICAL FIELD

The present disclosure relates to a solid-state imaging device.

BACKGROUND ART

Some solid-state imaging devices constituting image sensors such as CMOS have sensitivity in a wide wavelength range including, for example, an ultraviolet range to a near infrared range. In a solid-state imaging device having sensitivity in an ultraviolet range, an insulating film such as a BPSG (Boro-phospho silicate glass) film is formed as a protective film in a light sensitive region in order to suppress deterioration of the device due to ultraviolet light. In order for the insulating film to fully exert its function as a protective film, a thickness of, for example, about 1 μm is required. In this case, it is conceivable that incident light interferes between an upper surface of the insulating film and a main surface of a semiconductor substrate, and the spectral sensitivity varies with respect to the wavelength of the incident light. To solve such a problem, for example, in a solid-state imaging element described in Patent Literature 1, one or more uneven portions having a height difference of about one wavelength or more of the incident light are formed on the surface of the insulating film by forming a base pattern with periodic convex portions on a surface of a light receiving element.

CITATION LIST

Patent Literature

Patent Literature 1: Japanese Unexamined Patent Publication No. H6-125068

SUMMARY OF INVENTION

Technical Problem

In the solid-state imaging element described in Patent Literature 1, a variation in spectral sensitivity with respect to the wavelength of the incident light is reduced by forming an uneven portion on the surface of the insulating film and reducing an interference of the incident light in the insulating film. However, in the conventional solid-state imaging element, since the uneven portion pattern formed on the surface of the insulating film is uniform, the effect of reducing the interference of the incident light in the insulating film is limited. Thus, further measures are required in order to effectively reduce a variation in spectral sensitivity in a wide wavelength range including, for example, an ultraviolet range to a near infrared range.

The present disclosure has been made to solve the above-described problems and an object thereof is to provide a solid-state imaging device capable of effectively reducing a variation in spectral sensitivity in a wide wavelength range.

Solution to Problem

A solid-state imaging device according to an aspect of the present disclosure includes: a semiconductor substrate having a main surface provided with a plurality of light sensitive regions; and an insulating film provided on the main surface of the semiconductor substrate, wherein a plurality of uneven portions are formed on a surface on the side opposite to the main surface of the semiconductor substrate in the insulating film, and wherein a plurality of height differences of the uneven portions exist in the light sensitive region.

In the solid-state imaging device, a plurality of height differences exist in a plurality of uneven portions provided on the insulating film in the light sensitive region. Since the plurality of height differences exist, a plurality of interferences having different optical path lengths occur in the insulating film when the incident light is incident to the light sensitive region. Accordingly, since the periods of a variation in spectral sensitivity with respect to the wavelength of the incident light cancel each other, it is possible to reduce a variation in sensitivity in a wide wavelength range including, for example, an ultraviolet range to a near infrared range.

When the height difference of the uneven portion is measured at an interval of 0.01 μm in the light sensitive region, a maximum value of an appearance frequency of a surface height of the insulating film based on the highest top portion of the insulating film may be 5% or less. In this case, various height differences of the uneven portions exist on the insulating film and the effect that the periods of a variation in spectral sensitivity with respect to the wavelength of the incident light cancel each other can be improved. Thus, it is possible to more effectively reduce a variation in sensitivity in a wide wavelength range including, for example, an ultraviolet range to a near infrared range.

When the height difference of the uneven portion is measured at an interval of 0.01 μm in the light sensitive region, a standard deviation of an appearance frequency of a surface height of the insulating film based on the highest top portion of the insulating film may be 1% or less. In this case, various height differences of the uneven portions exist on the insulating film and the effect that the periods of a variation in spectral sensitivity with respect to the wavelength of the incident light cancel each other can be improved. Thus, it is possible to more effectively reduce a variation in sensitivity in a wide wavelength range including, for example, an ultraviolet range to a near infrared range.

The height difference between the highest top portion and the lowest bottom portion of the uneven portion in the light sensitive region may be 0.5 μm or more and 0.9 μm or less. Since the height difference is 0.5 μm or more, the optical path length difference of the incident light in the insulating film sufficiently increases. Accordingly, it is possible to further improve the effect that the periods of a variation in spectral sensitivity with respect to the wavelength of the incident light cancel each other. Further, since the height difference is 0.9 μm or less, the depth of the concave portion does not become excessive. Accordingly, it is possible to suppress the absolute value of the spectral sensitivity from being changed due to the refraction and reflection of the incident light on the surface of the insulating film.

The main surface of the semiconductor substrate may be a flat surface. In this case, since the shape of the main surface of the semiconductor substrate is simplified, the cost of the solid-state imaging device is reduced.

Advantageous Effects of Invention

According to the present disclosure, it is possible to effectively reduce a variation in spectral sensitivity in a wide wavelength range.

DESCRIPTION OF EMBODIMENTS

Hereinafter, preferred embodiments of a solid-state imaging device according to an aspect of the present disclosure will be described in detail with reference to the drawings.

[Schematic Configuration of Solid-State Imaging Device]

Figure 1:
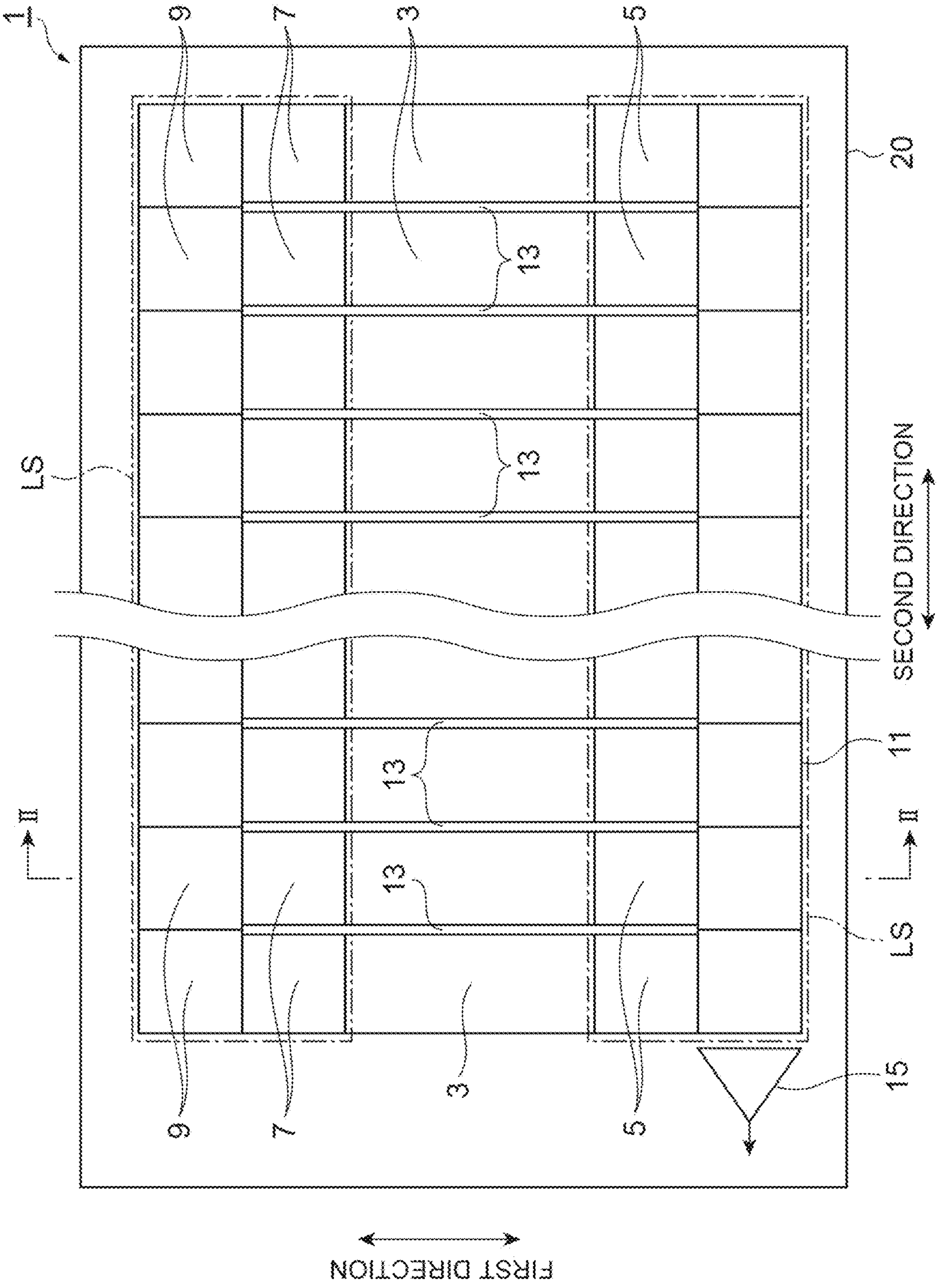
FIG. 1 is a plan view showing a schematic configuration of a solid-state imaging device.
Figure 2:
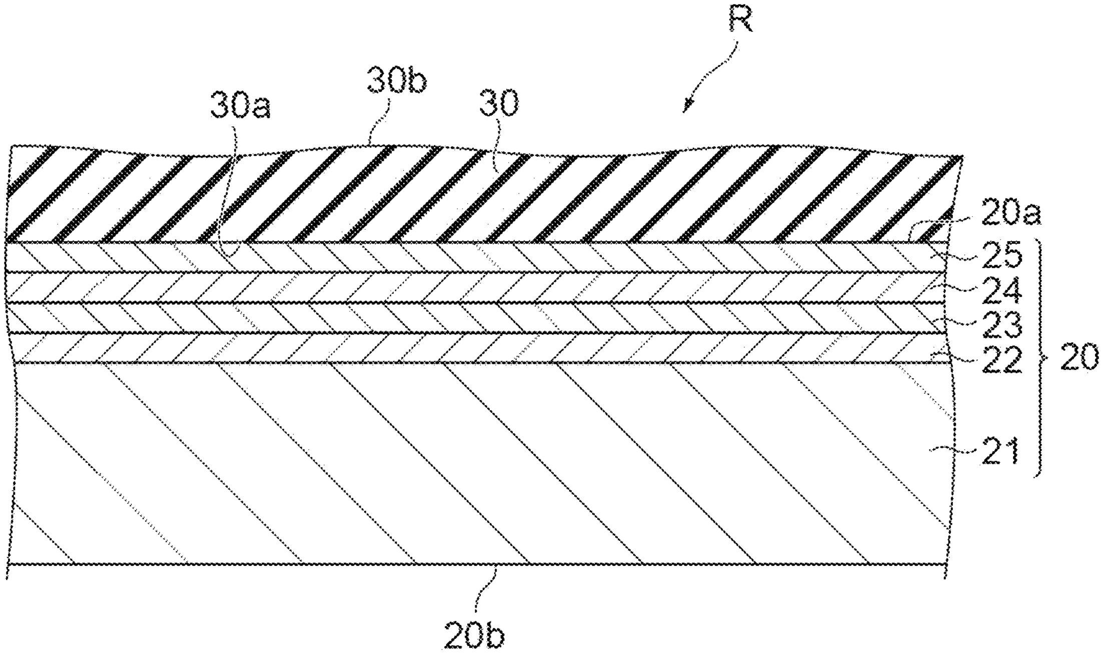
FIG. 2 is a cross-sectional view taken along a line II-II of FIG. 1.

FIG. 1 is a plan view showing a schematic configuration of the solid-state imaging device. Further, FIG. 2 is a cross-sectional view taken along a line II-II of FIG. 1. A solid-state imaging device 1 includes, as shown in FIG. 1, a plurality of light sensitive regions 3, a plurality of transfer gate units 5, a plurality of antiblooming gate units 7, a plurality of antiblooming drain units 9, and a shift register unit 11. These configurations are formed on a main surface 20*a* of a semiconductor substrate 20. The solid-state imaging device 1 of this embodiment is, for example, a surface-incident type image sensor and one light sensitive region 3 constitutes one pixel.

Each light sensitive region 3 responds to the incident light and generates an electric charge according to the incident light intensity. That is, the light sensitive region 3 functions as a photoelectric conversion unit. In this embodiment, the plane shape of the light sensitive region 3 has a rectangular shape formed by two long sides and two short sides. The plurality of light sensitive regions 3 are arranged along a second direction (a direction along the short side direction of the light sensitive region 3) orthogonal to a first direction along the long side direction of the light sensitive region 3 and are arranged in an array in a one-dimensional direction. The shape of the light sensitive region 3 is not limited to the above-described substantially rectangular shape and various shapes can be adopted.

Each transfer gate unit 5 corresponds to each light sensitive region 3 and is disposed on one short side of the plane shape of the light sensitive region 3. That is, the plurality of transfer gate units 5 are arranged in the second direction on one short side of the plane shape of the light sensitive region 3. The transfer gate unit 5 acquires an electric charge generated in the light sensitive region 3 and transfers the acquired electric charge as a signal charge in the first direction. An isolation region 13 is disposed between the adjacent transfer gate units 5. The isolation region 13 realizes electrical separation between the transfer gate units 5.

Each antiblooming gate unit 7 corresponds to each light sensitive region 3 and is disposed on the other short side of the plane shape of the light sensitive region 3. That is, the plurality of antiblooming gate units 7 are arranged in the second direction on the other short side of the plane shape of the light sensitive region 3. The antiblooming gate unit 7 acquires an electric charge generated in the light sensitive region 3 and transfers the acquired electric charge as an unnecessary charge in the first direction. The isolation region 13 is disposed between the adjacent antiblooming gate units 7. The isolation region 13 realizes electrical separation between the antiblooming gate units 7.

Each antiblooming drain unit 9 corresponds to each of the plurality of antiblooming gate units 7 and is disposed adjacent to the antiblooming gate unit 7 in the first direction. That is, the plurality of antiblooming drain units 9 are arranged in the second direction on the other short side of the plane shape of the light sensitive region 3. The antiblooming drain unit 9 is connected to a predetermined fixed potential and discharges the unnecessary charge transferred from the corresponding antiblooming gate unit 7.

The shift register unit 11 corresponds to each of the plurality of transfer gate units 5 and is disposed adjacent to the transfer gate unit 5 in the first direction. That is, the plurality of shift register units 11 are arranged in the second direction on the other short side of the plane shape of the light sensitive region 3. The shift register unit 11 receives the signal charge transferred from each transfer gate unit 5, transfers the signal charges in the second direction, and sequentially outputs the signal charges to a read amplifier unit 15. The signal charge output from the shift register unit 11 is converted into a voltage by the read amplifier unit 15 and is output to the outside of the solid-state imaging device 1 as a voltage for each of the light sensitive regions 3 arranged in the second direction.

A light shielding film LS is disposed in a region except for the plurality of light sensitive regions 3. In this embodiment, the light shielding film LS is disposed to cover the transfer gate unit 5, the antiblooming gate unit 7, the antiblooming drain unit 9, and the shift register unit 11. The light shielding film LS can prevent light from entering these regions and prevent the generation of unnecessary charges due to the light incident on these regions.

In the light sensitive region 3, as shown in FIG. 2, an insulating film 30 is provided on the main surface 20*a* of the semiconductor substrate 20. The semiconductor substrate 20 includes the main surface 20*a* and a main surface 20*b* which face each other. In this embodiment, both the main surface 20*a* and the main surface 20*b* are flat surfaces and the main surface 20*a* is the light incident surface of the semiconductor substrate 20. The semiconductor substrate 20 includes a p type semiconductor region 21, a p− type semiconductor region 22, an n+ type semiconductor region 23, a p+ type semiconductor region 24, and an oxide film 25 from the side of the main surface 20*b*. In this embodiment, the semiconductor substrate 20 is made of Si. When the semiconductor substrate 20 is made of Si, Group 3 elements such as B are used as p type impurities, and Group 5 elements such as P and As are used as n type impurities.

The oxide film 25 is, for example, a silicon oxide film. This oxide film 25 functions as a gate oxide film of a MOS transistor in the transfer gate unit 5. Further, the oxide film 25 has a role of preventing the components from the insulating film 30 from invading the semiconductor substrate 20 in the light sensitive region 3. For example, when the insulating film 30 is a BPSG film as described later, the oxide film 25 prevents B (boron) and P (phosphorus) from the BPSG film from invading the semiconductor substrate 20.

Additionally, when the oxide film 25 is provided on the semiconductor substrate 20, the surface of the oxide film 25 can be regarded as the main surface 20*a* of the semiconductor substrate 20. When the oxide film 25 is not provided on the semiconductor substrate 20, the surface of the p+ type semiconductor region 24 is the main surface 20*a* of the semiconductor substrate 20. The semiconductor region constituting the semiconductor substrate 20 is not limited to the configuration of FIG. 2. For example, the p+ type semiconductor region 24 may not be provided, the n+ type semiconductor region 23 may be located on the p− type semiconductor region 22, and the oxide film 25 may be directly formed on the n+ type semiconductor region 23.

The insulating film 30 includes a main surface 30*a* and a main surface 30*b* which face each other. The main surface 30*a* is a surface facing the side of the main surface 20*a* of the semiconductor substrate 20 and the main surface 30*b* is a surface facing the side opposite to the main surface 20*a* of the semiconductor substrate 20. The insulating film 30 can be formed, for example, by vapor deposition or the like. The main surface 30*a* follows the shape of the main surface 20*a* of the semiconductor substrate 20 and is a flat surface. On the other hand, a plurality of uneven portions R are formed on the main surface 30*b*. This uneven portion R has a gently continuous shape by forming an uneven portion having a rectangular cross-sectional shape by etching or mechanical polishing and then flowing a part of the uneven portion having the rectangular cross-sectional shape by heat treatment. The insulating film 30 is, for example, a BPSG (Boro-phospho silicate glass) film and also functions as an antireflection film (AR film).

The thickness of the insulating film 30 is different for each part of the plurality of uneven portions R, but is, for example, 0.5 μm to 3 μm. The lower limit value of the thickness of the insulating film 30 is a value determined in consideration of the function as a protective film, that is, exhibiting sufficient ultraviolet light resistance. Further, the upper limit value of the thickness of the insulating film 30 is a value determined in consideration of process restrictions (for example, ease of forming contact holes) and the like.

[Detailed Configuration of Uneven Portion of Insulating Film]

Figure 3:
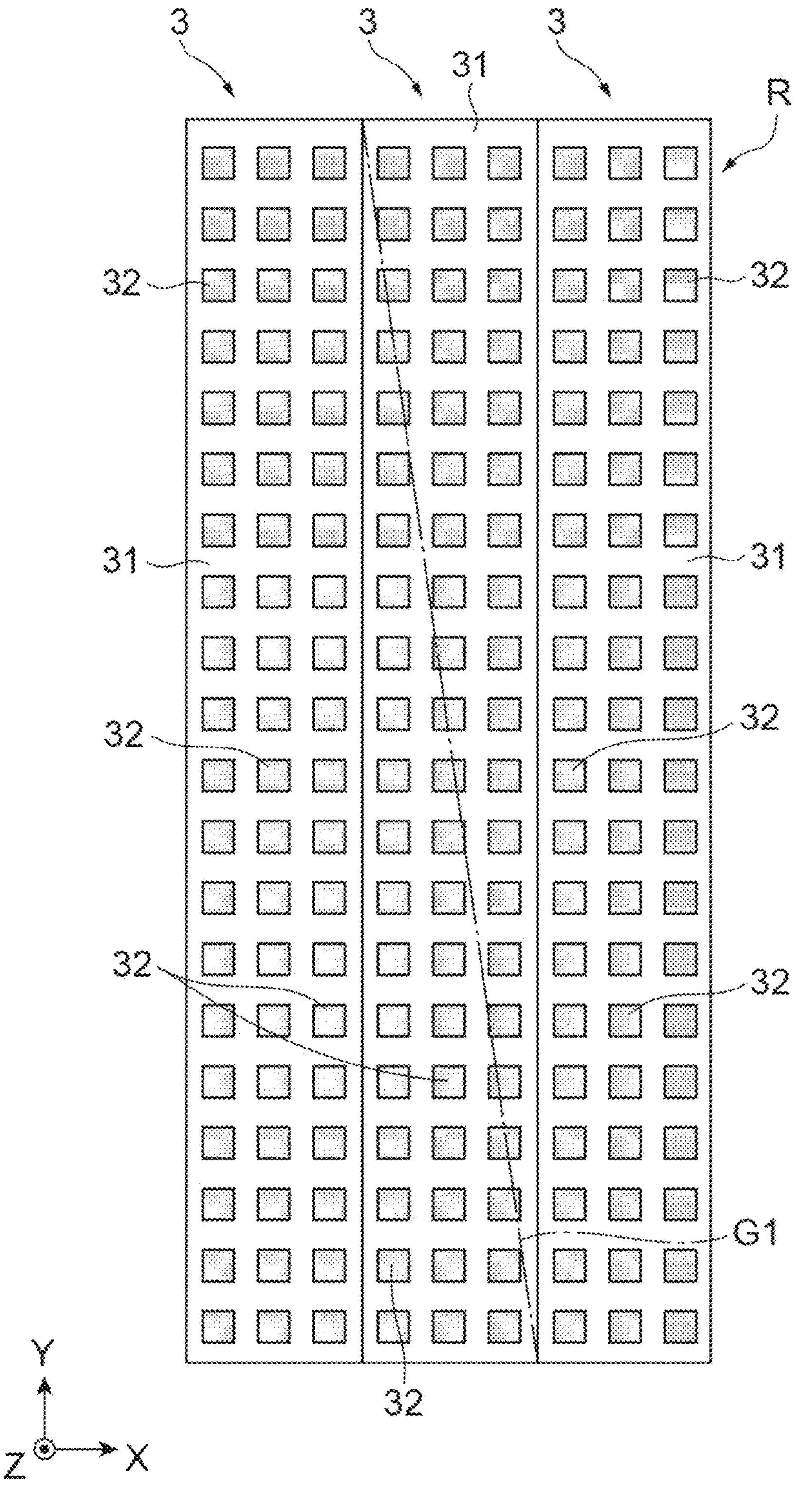
FIG. 3 is a plan view showing a pattern of an uneven portion of an insulating film.
Figure 4:
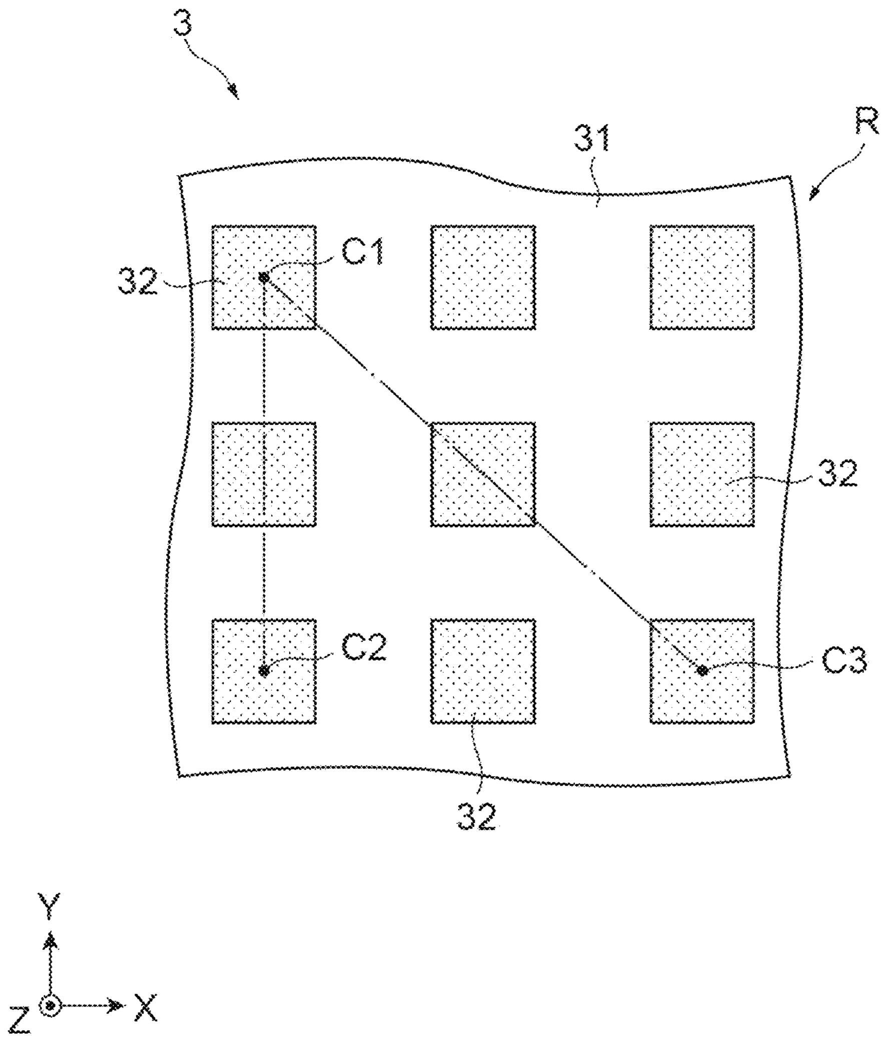
FIG. 4 is a main enlarged view of FIG. 3.

FIG. 3 is a plan view showing a pattern of the uneven portion of the insulating film. Further, FIG. 4 is a main enlarged view thereof. FIG. 3 shows the light sensitive region 3 for three pixels, the first and second directions shown in FIG. 1 correspond to the Y direction and the X direction, and the thickness direction of the semiconductor substrate 20 shown in FIG. 2 corresponds to the Z direction. In FIGS. 3 and 4, in the uneven portion R, a region corresponding to a convex portion 31 is indicated by a solid color and a region corresponding to a concave portion 32 is indicated by a dot color. When a height position of a top portion 31*a* of the convex portion 31 is 1 and a height position of a bottom portion 32*a* of the concave portion 32 is 0, a region corresponding to the convex portion 31 is a region in which the height position is 0.5 or more and 1 or less and a region corresponding to the concave portion 32 is a region in which the height position is 0 or more and less than 0.5.

As shown in FIGS. 3 and 4, in the light sensitive region 3, the plurality of uneven portions R are formed on the side of the main surface 30*b* of the insulating film 30 by waving the main surface 30*b* of the insulating film 30 in a sinusoidal shape. In the example of FIGS. 3 and 4, the concave portions 32 each having a substantially square shape in a plan view are arranged in a matrix in the in-plane direction of the main surface 30*b* of the insulating film 30 and the other portions are the convex portions 31. In each of the X direction and the Y direction, one side of the concave portion 32 is about 3.0 μm and the pitch between the concave portions 32 and 32 is about 3.0 μm.

Figure 5:
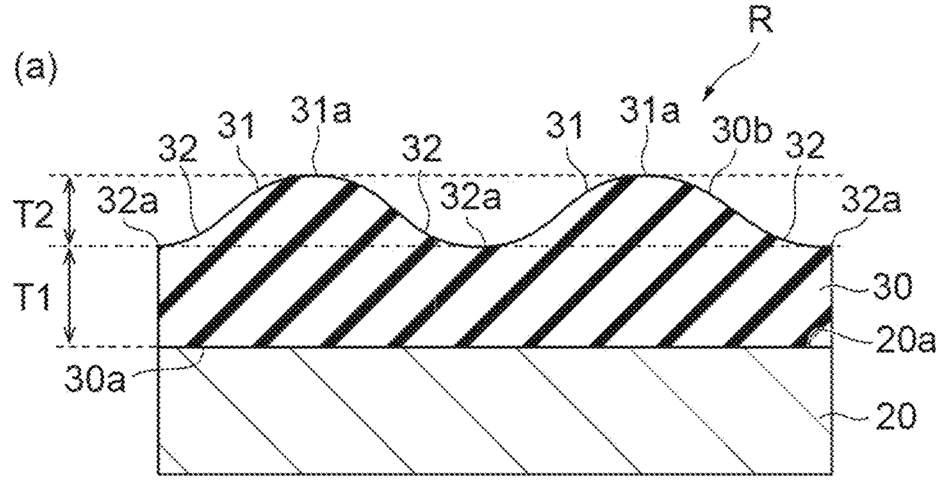
FIG. 5(*a*) is a cross-sectional view taken along a line C1-C2 of FIG. 4 and FIG. 5(*b*) is a cross-sectional view taken along a line C1-C3 of FIG. 4.
Figure 5:
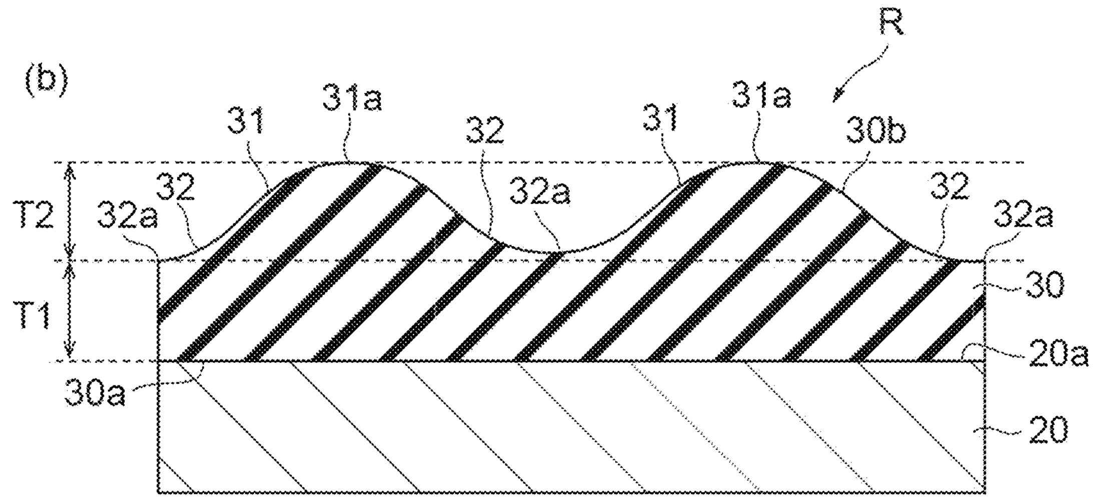

In the light sensitive region 3, a plurality of height differences of the uneven portions R exist. For example, when looking at the cross-section (see FIG. 4) from the center C1 of one concave portion 32 to the center C2 of two adjacent concave portions 32 in the Y direction, as shown in FIG. 5(*a*), the thickness T1 of the insulating film 30 of the bottom portion 32*a* of the concave portion 32 is about 0.85 μm and the height difference (the thickness from the bottom portion 32*a* of the concave portion 32 to the top portion 31*a* of the convex portion 31) T2 of the uneven portion R is about 0.7 μm. The maximum thickness (=T1+T2) of the insulating film 30 is about 1.55 μm.

Further, for example, when looking at the cross-section (see FIG. 4) from the center C1 of one concave portion 32 to the center C3 of two adjacent concave portions 32 in the X direction and the Y direction, as shown in FIG. 5(*b*), the thickness T1 of the insulating film 30 of the bottom portion 32*a* of the concave portion 32 is about 0.85 μm and the height difference (the thickness from the bottom portion 32*a* of the concave portion 32 to the top portion 31*a* of the convex portion 31) T2 of the uneven portion R is about 0.9 μm. The maximum thickness (=T1+T2) of the insulating film 30 is about 1.75 μm.

Further, the height difference F (see FIG. 9) between the highest top portion and the lowest bottom portion of the uneven portion R is 0.5 μm or more and 0.9 μm or less. The highest top portion indicates the top portion 31*a* having the highest height from the main surface 20*a* of the semiconductor substrate 20 in the top portion 31*a* of the plurality of convex portions 31 and the lowest bottom portion indicates the bottom portion 32*a* having the lowest height from the main surface 20*a* of the semiconductor substrate 20 in the bottom portion 32*a* of the plurality of concave portions 32.

Figure 6:
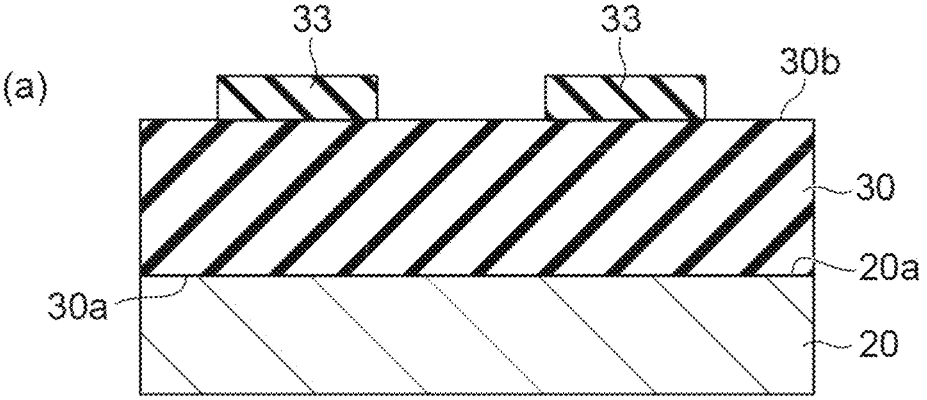
FIG. 6 is a schematic cross-sectional view showing the formation of an uneven portion of an insulating layer.
Figure 6:
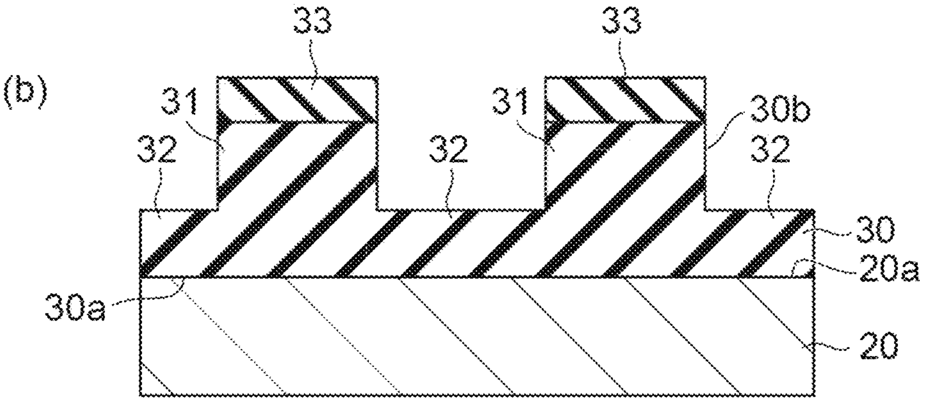
Figure 6:
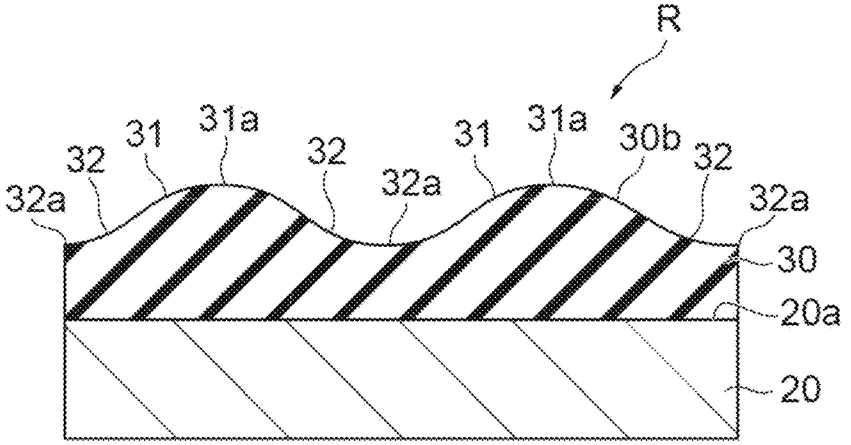

The uneven portion R of the insulating film 30 is formed by, for example, dry etching and heat treatment. First, as shown in FIG. 6(*a*), a resist 33 corresponding to the formation position of the convex portion 31 is formed on the main surface 30*b* of the insulating film 30 by photolithography. Next, as shown in FIG. 6(*b*), a portion not provided with the resist 33 in the insulating film 30 is dry-etched to form the concave portion 32. After the concave portion 32 is formed, the resist 33 is removed. Then, when the heat treatment is performed on the insulating film 30 and a part of the uneven portion R having a rectangular cross-sectional shape is allowed to flow, the gently continuous uneven portion R is formed on the side of the main surface 30*b* of the insulating film 30 as shown in FIG. 6(*c*).

According to the above-described manufacturing method, since the flow amount of the uneven portion R during the heat treatment is constant, the height position of the top portion 31*a* of the convex portion 31 becomes higher as the pitch between the concave portions 32 and 32 before the heat treatment becomes larger and the height position of the top portion 31*a* of the convex portion 31 becomes lower as the pitch between the concave portions 32 and 32 before the heat treatment becomes smaller. That is, the height difference T2 of the concave portion 32 can be adjusted by the pitch between the concave portions 32 and 32 before the heat treatment.

Figure 7:
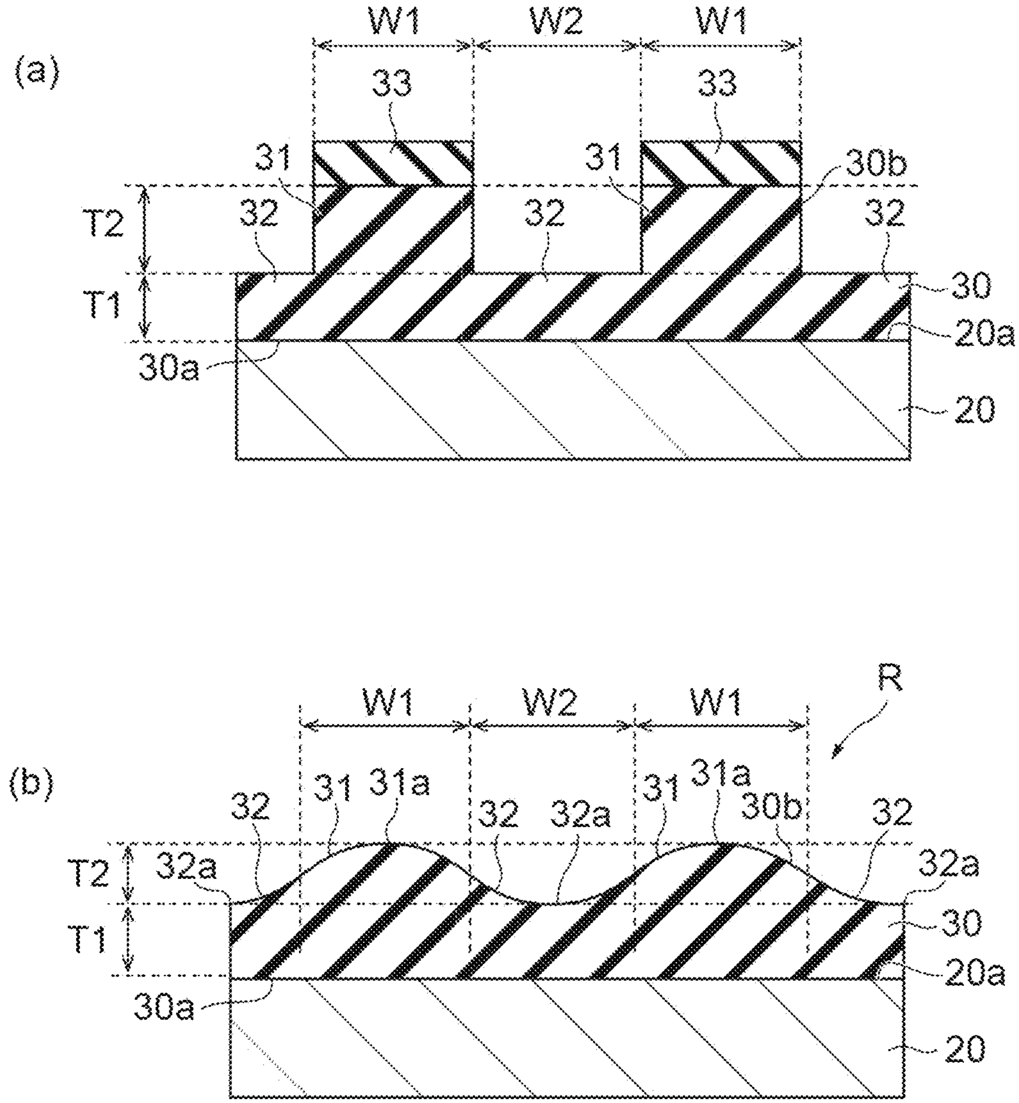
FIG. 7 is a schematic cross-sectional view showing a relationship between heat treatment and an interval of the uneven portion.
Figure 8:
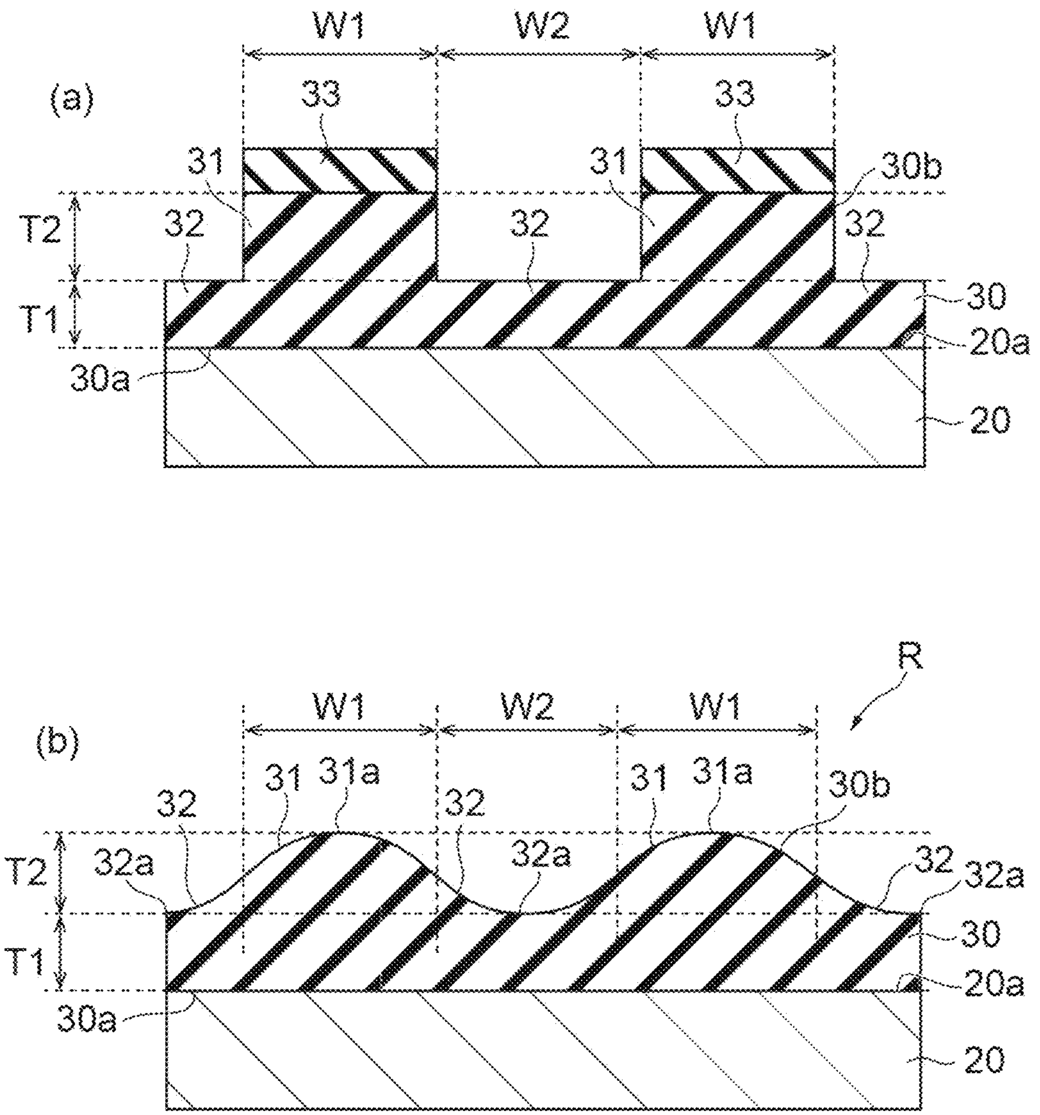
FIG. 8 is a schematic cross-sectional view showing a relationship between heat treatment and an interval of the uneven portion.

In the example of FIG. 7(*a*), in the state before the heat treatment, both the width W1 of the convex portion 31 and the width W2 of the concave portion 32 are 3.0 μm and the thickness T2 from the bottom portion 32*a* of the concave portion 32 to the top portion 31*a* of the convex portion 31 is 1.4 μm. In this case, in the state after the heat treatment, as shown in FIG. 7(*b*), both the width W1 of the convex portion 31 and the width W2 of the concave portion 32 are kept to 3.0 μm and the height difference T2 of the concave portion 32 is 0.7 μm. On the other hand, in the example of FIG. 8(*a*), in the state before the heat treatment, both the width W1 of the convex portion 31 and the width W2 of the concave portion 32 are 4.2 μm and the thickness T2 from the bottom portion 32*a* of the concave portion 32 to the top portion 31*a* of the convex portion 31 is 1.4 μm. In this case, in the state after the heat treatment, as shown in FIG. 8(*b*), both the width W1 of the convex portion 31 and the width W2 of the concave portion 32 are kept to 4.2 μm and the height difference T2 of the concave portion 32 is 0.9 μm.

Figure 9:
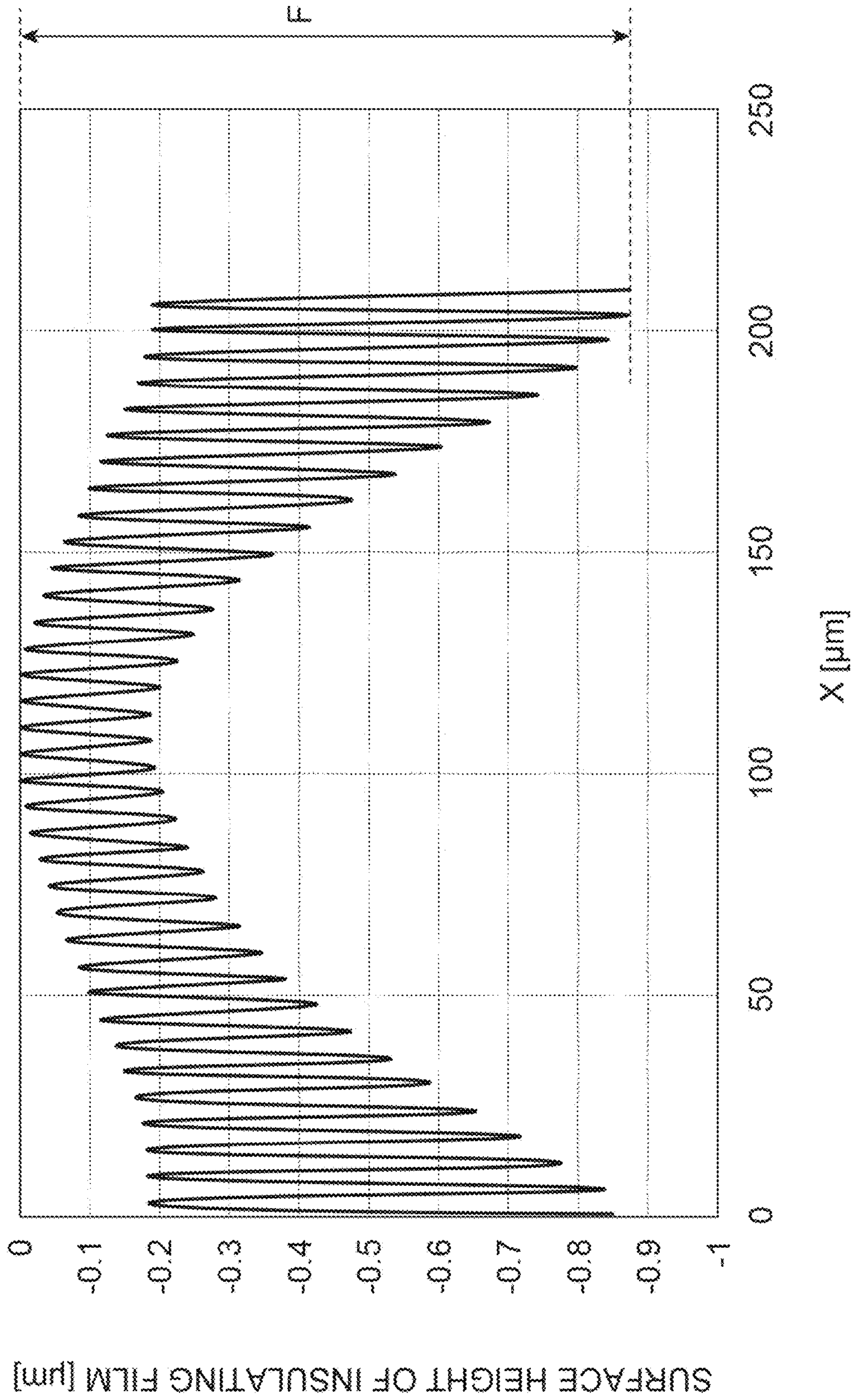
FIG. 9 is a graph showing a height difference profile of the uneven portion of the pattern shown in FIG. 4.

FIG. 9 is a graph showing a height difference profile of the uneven portion of the pattern shown in FIG. 4. In the profile of the same drawing, the horizontal axis is the position in the X direction and the vertical axis is the height position of the insulating film 30. In the vertical axis, the height position of the top portion 31*a* of the convex portion 31 is used as a reference (=0 μm). The height difference profile of the uneven portion R is obtained by scanning a depth gauge along a scan line G1 set on the diagonal line of the light sensitive region 3 for one pixel. By scanning the depth gauge along the scan line G1, it is possible to obtain the height difference profile equivalent to the case where the scan line is slid diagonally with respect to one concave portion 32 and the peripheral convex portion 31.

As shown in FIG. 9, in the pattern of the uneven portion R shown in FIG. 4, the height position of the top portion 31*a* of the convex portion 31 becomes 0 μm at the center of the scan direction, gradually decreases from the center to the end in the scan direction, and becomes −0.2 μm at both ends of the scan direction. Further, the height position of the bottom portion 32*a* of the concave portion 32 becomes −0.2 μm at the center of the scan direction, gradually decreases from the center to the end of the scan direction, and becomes −0.9 μm at both ends of the scan direction. From the result of FIG. 9, it can be seen that the height position difference between the top position and the bottom position of one amplitude in the height difference profile is small at the center in the scan direction and gradually increases from the center to the end. That is, in the light sensitive region 3, it can be seen that a plurality of height differences of the uneven portions R exist on the main surface 30*b* of the insulating film 30.

Figure 10:
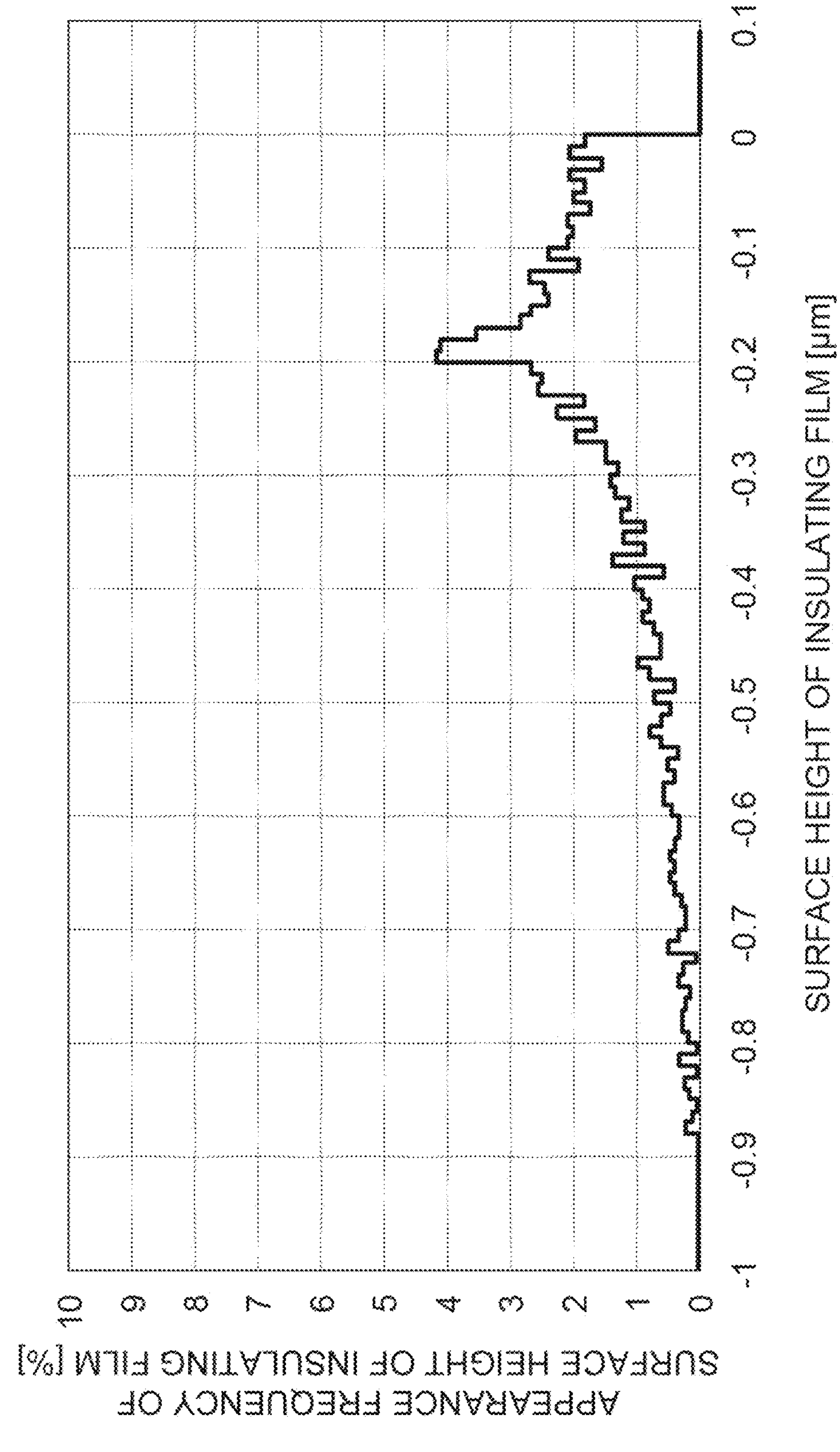
FIG. 10 is a graph showing an appearance frequency of a surface height of the insulating film in the pattern shown in FIG. 4.

Further, in the light sensitive region 3, when the height difference of the uneven portion R is measured at the interval of 0.01 μm, the maximum value of the appearance frequency of the surface height of the insulating film 30 based on the highest top portion of the insulating film 30 is 5% or less. FIG. 10 is a graph showing the appearance frequency of the surface height of the insulating film of the pattern shown in FIG. 4. In the same drawing, the horizontal axis indicates the surface height of the insulating film and the vertical axis indicates the appearance frequency. The resolution when calculating the appearance frequency is 0.01 μm. As shown in the same drawing, in the pattern of the uneven portion R shown in FIG. 4, the surface height of the insulating film is widely distributed from 0 μm to −0.9 μm and the peak of the appearance frequency is located in the vicinity of −0.2 μm. The appearance frequency is about 4% even in the vicinity of −0.2 μm which is the position of the peak, is about 1.5% to 4% in the range from −0.2 μm to 0 μm and from −0.2 μm to −0.3 μm, and is 1% or less in the range from −0.4 μm to −0.9 μm. From this result, in the uneven portion R of the pattern shown in FIG. 4, it can be seen that the height difference of the uneven portion is not biased to a specific value and the height difference of various values is uniformly included to some extent.

[Operation and Effect of Uneven Portion of Insulating Film]

In the solid-state imaging device 1 with the above-described configuration, since a plurality of height differences of the uneven portions R provided on the side of the main surface 30*b* of the insulating film 30 exist in the light sensitive region 3, a plurality of interferences having different optical path lengths will occur in the insulating film 30 when the incident light is incident to the light sensitive region 3. Accordingly, since the periods of a variation in spectral sensitivity with respect to the wavelength of the incident light cancel each other, it is possible to reduce a variation in sensitivity in a wide wavelength range including, for example, an ultraviolet range to a near infrared range.

Further, in the solid-state imaging device 1, when the height difference of the uneven portion R is measured at the interval of 0.01 μm in the light sensitive region 3, the maximum value of the appearance frequency of the surface height of the insulating film based on the highest top portion of the insulating film 30 is 5% or less. Accordingly, various height differences of the uneven portions R exist on the insulating film 30 and the effect that the periods of a variation in spectral sensitivity with respect to the wavelength of the incident light cancel each other can be improved. Thus, it is possible to more effectively reduce a variation in sensitivity in a wide wavelength range including, for example, an ultraviolet range to a near infrared range.

Further, in the solid-state imaging device 1, the height difference F between the highest top portion and the lowest bottom portion of the uneven portion R in the light sensitive region 3 is 0.5 μm or more and 0.9 μm or less. Since the height difference F is 0.5 μm or more, the optical path length difference of the incident light in the insulating film 30 sufficiently increases. Accordingly, it is possible to further improve the effect that the periods of a variation in spectral sensitivity with respect to the wavelength of the incident light cancel each other. Further, since the height difference F is 0.9 μm or less, the depth of the concave portion 32 does not become excessive. Accordingly, it is possible to suppress the absolute value of the spectral sensitivity from being changed due to the refraction and reflection of the incident light on the surface of the insulating film 30.

Further, in the solid-state imaging device 1, the main surface 20*a* of the semiconductor substrate 20 provided with the insulating film 30 is a flat surface. Accordingly, since the shape of the main surface 20*a* of the semiconductor substrate 20 is simplified, the cost of the solid-state imaging device 1 can be reduced.

Figure 11:
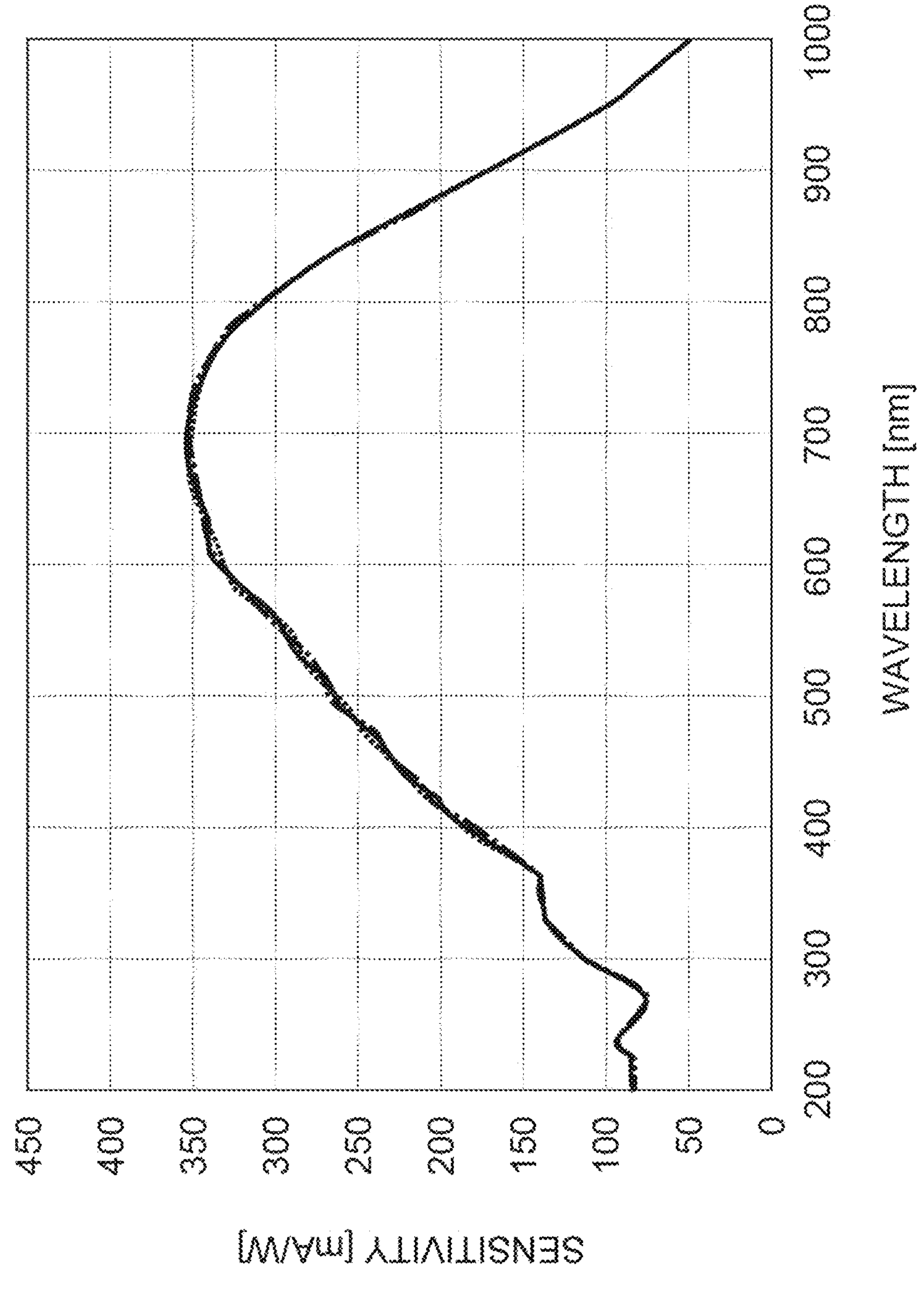
FIG. 11 is a graph showing spectral sensitivity characteristics in an ultraviolet range to a near infrared range of the solid-state imaging device having the uneven portion of the pattern shown in FIG. 4.
Figure 12:
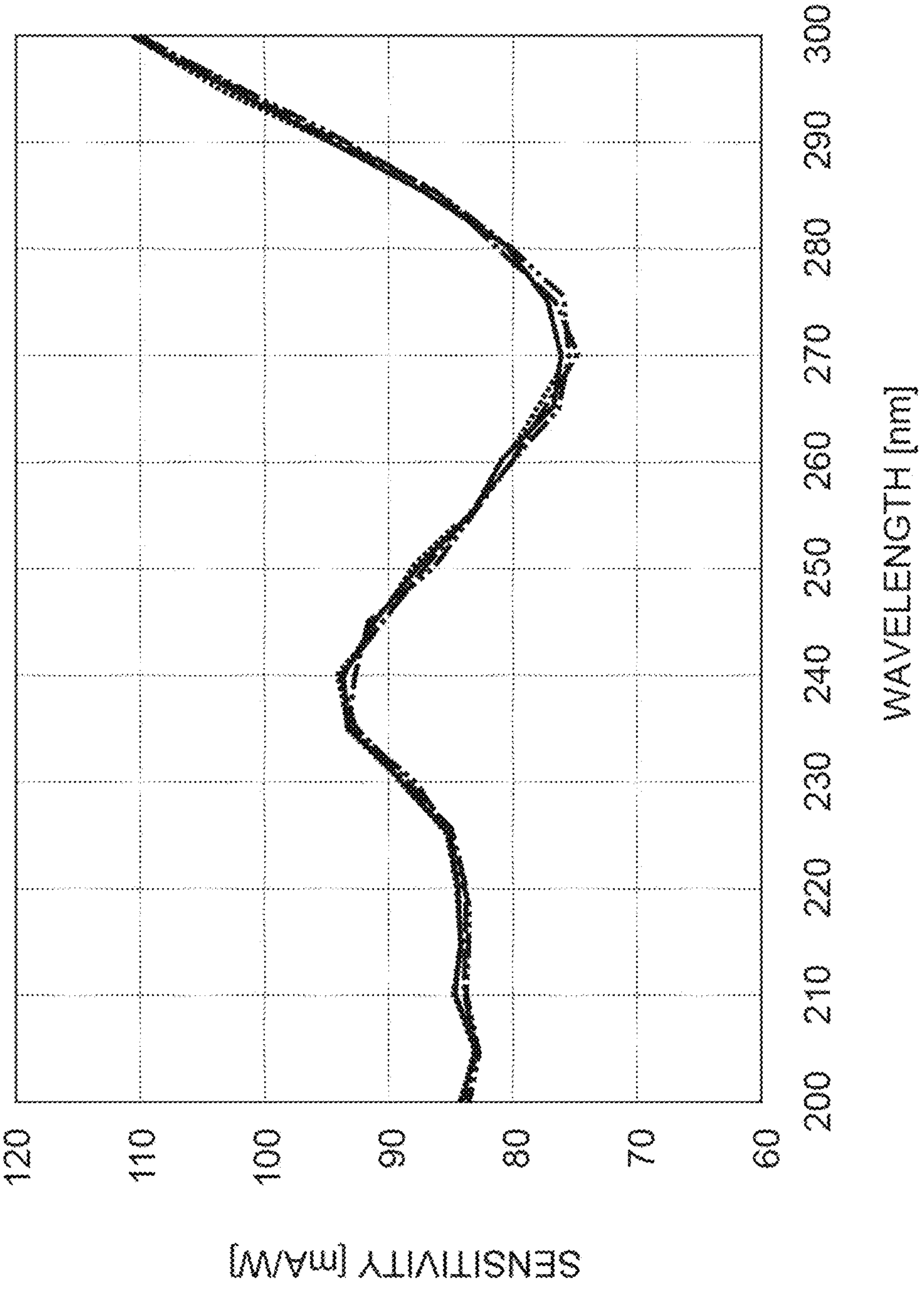
FIG. 12 is an enlarged graph showing spectral sensitivity characteristics in the ultraviolet range of the solid-state imaging device having the uneven portion of the pattern shown in FIG. 4.

FIGS. 11 and 12 are graphs showing spectral sensitivity characteristics of the solid-state imaging device having the uneven portion of the pattern shown in FIG. 4. FIG. 11 shows spectral sensitivity characteristics in a wide wavelength range including an ultraviolet range to a near infrared range and FIG. 12 shows spectral sensitivity characteristics in an ultraviolet range in an enlarged state. In FIGS. 11 and 12, the horizontal axis indicates the wavelength, the vertical axis indicates the sensitivity, and the spectral sensitivity characteristics of four samples having the same configuration as the above-described embodiment are superimposed and plotted. As shown in FIGS. 11 and 12, in the embodiment, since the periods of a variation in spectral sensitivity with respect to the wavelength of the incident light cancel each other, it can be confirmed that the peaks and valleys do not occur in the spectral sensitivity profile and a variation in sensitivity in a wide wavelength range including an ultraviolet range to a near infrared range are effectively reduced. Further, it can be confirmed that a variation in spectral sensitivity characteristic between the samples is very small.

Figure 13:
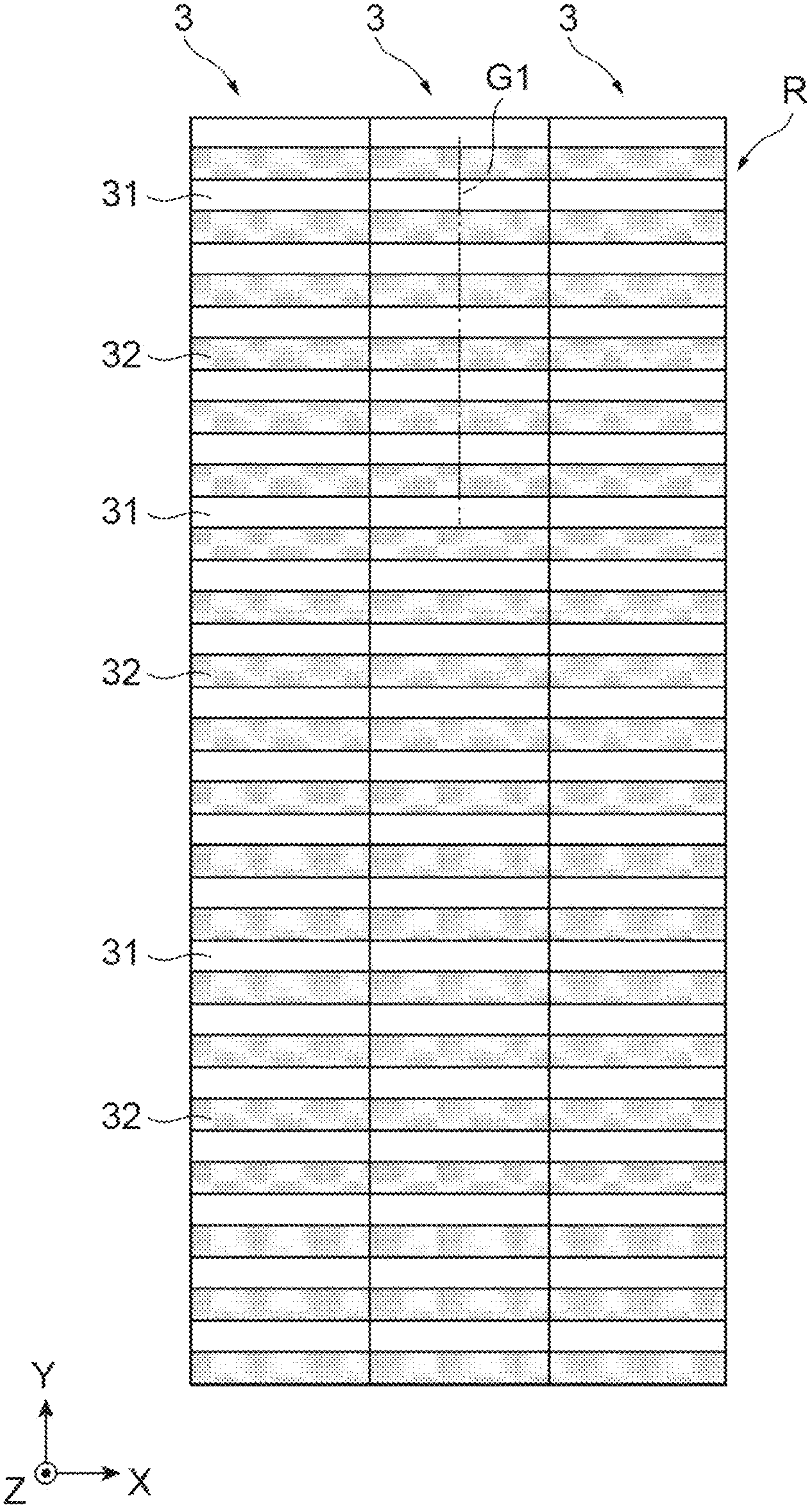
FIG. 13 is a plan view showing a pattern of an uneven portion of an insulating film according to a comparative example.
Figure 14:
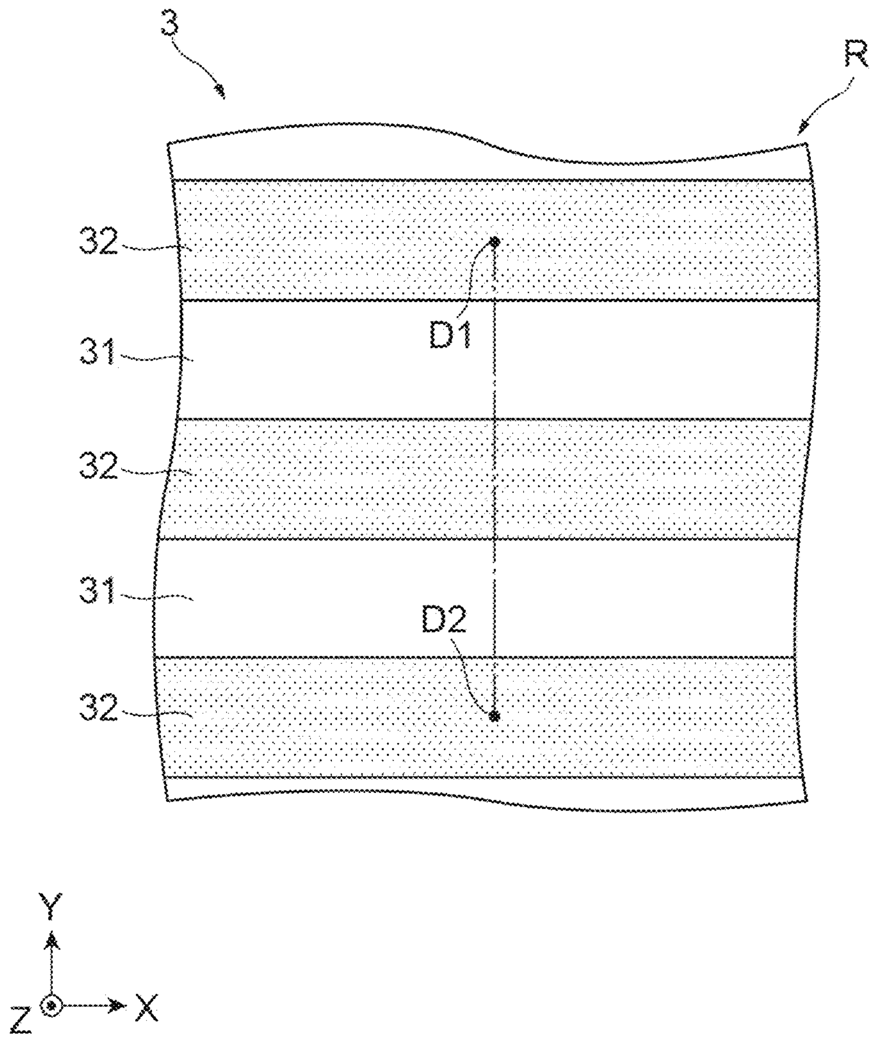
FIG. 14 is a main enlarged view of FIG. 13.

On the other hand, FIG. 13 is a plan view showing a pattern of an uneven portion of an insulating film according to a comparative example. Further, FIG. 14 is a main enlarged view thereof. In the example of FIGS. 13 and 14, the uneven portion R includes a convex portion 31 extending in a band shape in the X direction and a concave portion 32 extending in a band shape in the Y direction in a plan view and the convex portion 31 and the concave portion 32 are alternately arranged in the Y direction. Both the width of the convex portion 31 and the width of the concave portion 32 in the Y direction are 3.0 μm.

Figure 15:
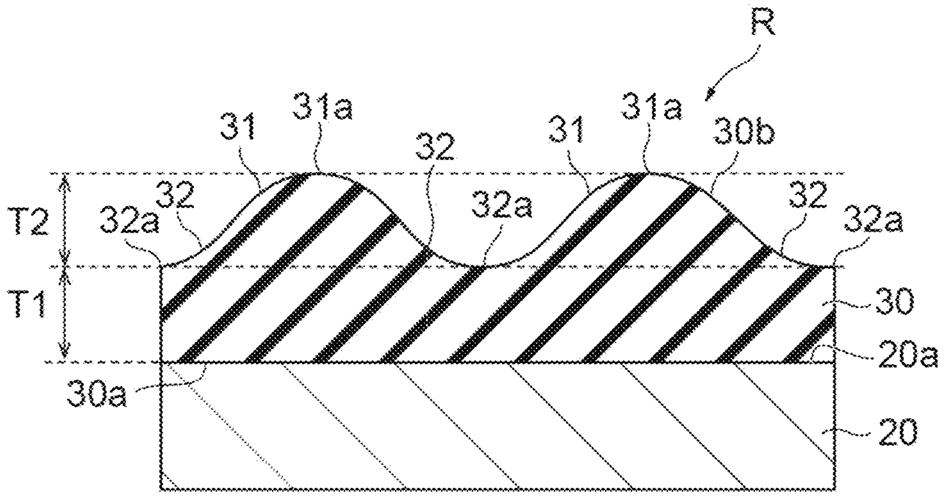
FIG. 15 is a cross-sectional view taken along a line D1-D2 of FIG. 14.

In this comparative example, for example, when looking at the cross-section (see FIG. 14) from the center D1 of one concave portion 32 to the center D2 of two adjacent concave portions 32 in the Y direction, as shown in FIG. 15, the thickness T1 of the insulating film 30 of the bottom portion 32*a* of the concave portion 32 is about 0.85 μm and the height difference (the thickness from the bottom portion 32*a* of the concave portion 32 to the top portion 31*a* of the convex portion 31) T2 of the uneven portion R is about 0.9 μm. The maximum thickness (=T1+T2) of the insulating film 30 is about 1.75 μm.

Figure 16:
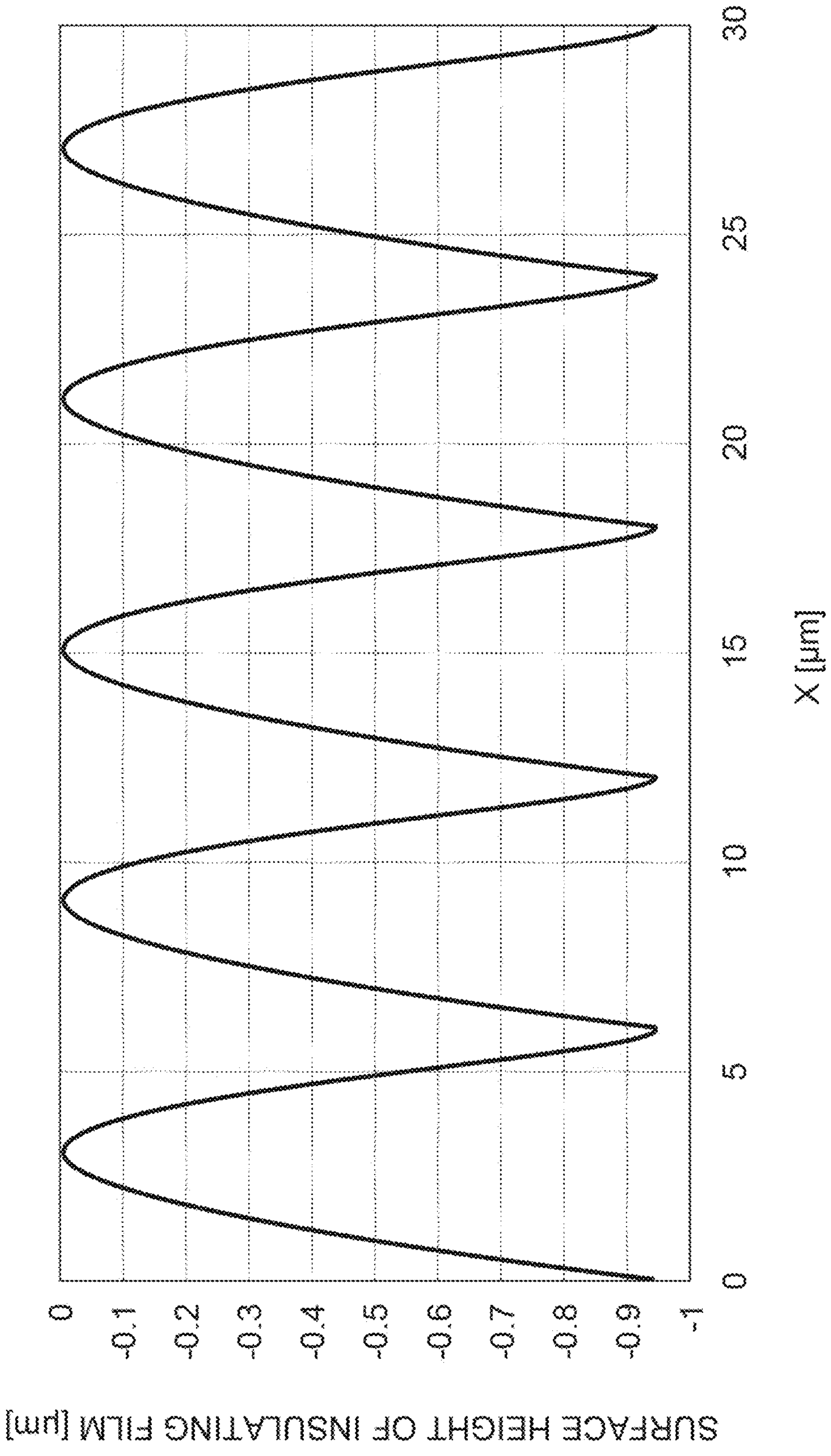
FIG. 16 is a graph showing a height difference profile of the uneven portion of the pattern shown in FIG. 14.

FIG. 16 is a graph showing the height difference profile of the uneven portion of the pattern shown in FIG. 14. The height difference profile of the uneven portion R is obtained by scanning a depth gauge along a scan line G2 (see FIG. 13) set in the Y direction of the light sensitive region for one pixel. In the pattern of the uneven portion R shown in FIG. 14, the height position of the top portion 31*a* of the convex portion 31 is 0 μm in the vicinity of the center of the convex portion 31 in the Y direction and the height position of the bottom portion 32*a* of the concave portion 32 is −1 μm in the vicinity of the center of the concave portion 32 in the Y direction. From the result of FIG. 16, it can be seen that the height difference of the uneven portion R is single in the pattern shown in FIG. 14.

Figure 17:
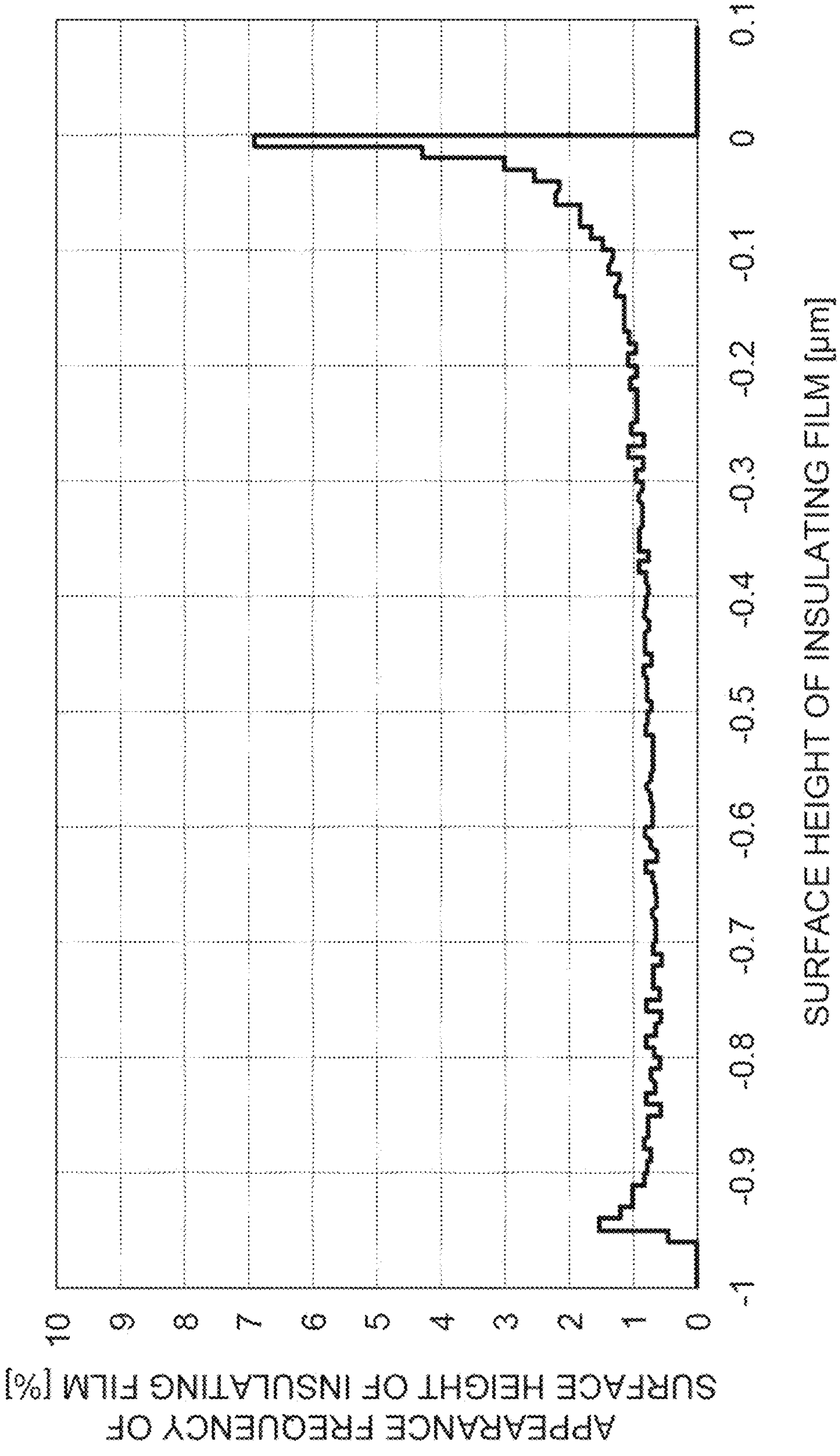
FIG. 17 is a graph showing an appearance frequency of a surface height of the insulating film in the pattern shown in FIG. 14.

FIG. 17 is a graph showing the appearance frequency of the surface height of the insulating film of the pattern shown in FIG. 14. In the same drawing, the resolution of the depth when calculating the appearance frequency is 0.01 μm as in the case of FIG. 10. As shown in the same drawing, in the pattern of the uneven portion R shown in FIG. 14, the appearance frequency of the surface height of the insulating film is concentrated in the range from 0 μm to −0.1 μm and the appearance frequency reaches about 7% at the peak of the appearance frequency located in the vicinity of 0 μm. From this result, it can be seen that the height difference of the uneven portion is biased to a specific value in the uneven portion R of the pattern shown in FIG. 14.

Figure 18:
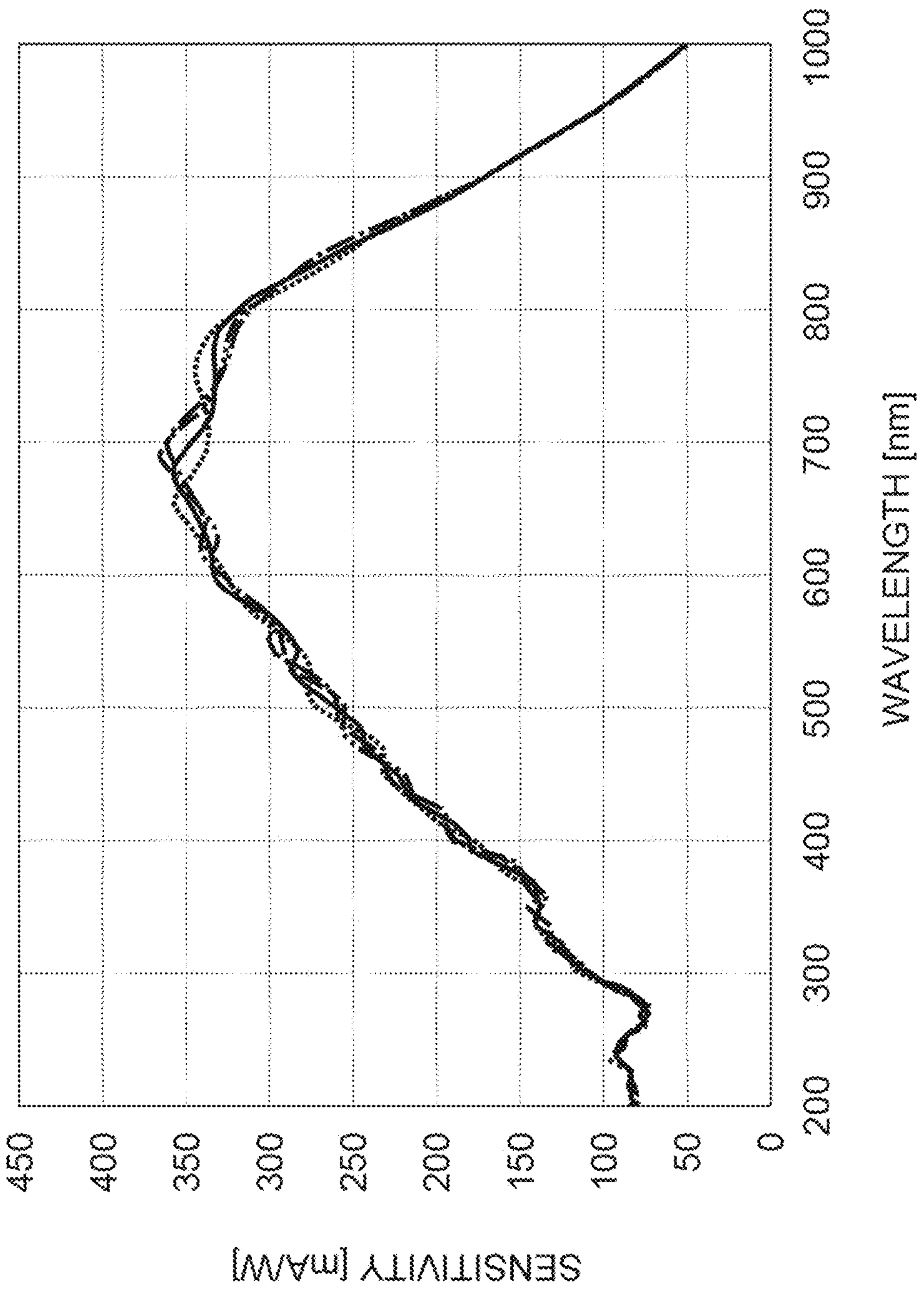
FIG. 18 is a graph showing spectral sensitivity characteristics in an ultraviolet range to a near infrared range of a solid-state imaging device having the uneven portion of the pattern shown in FIG. 14.
Figure 19:
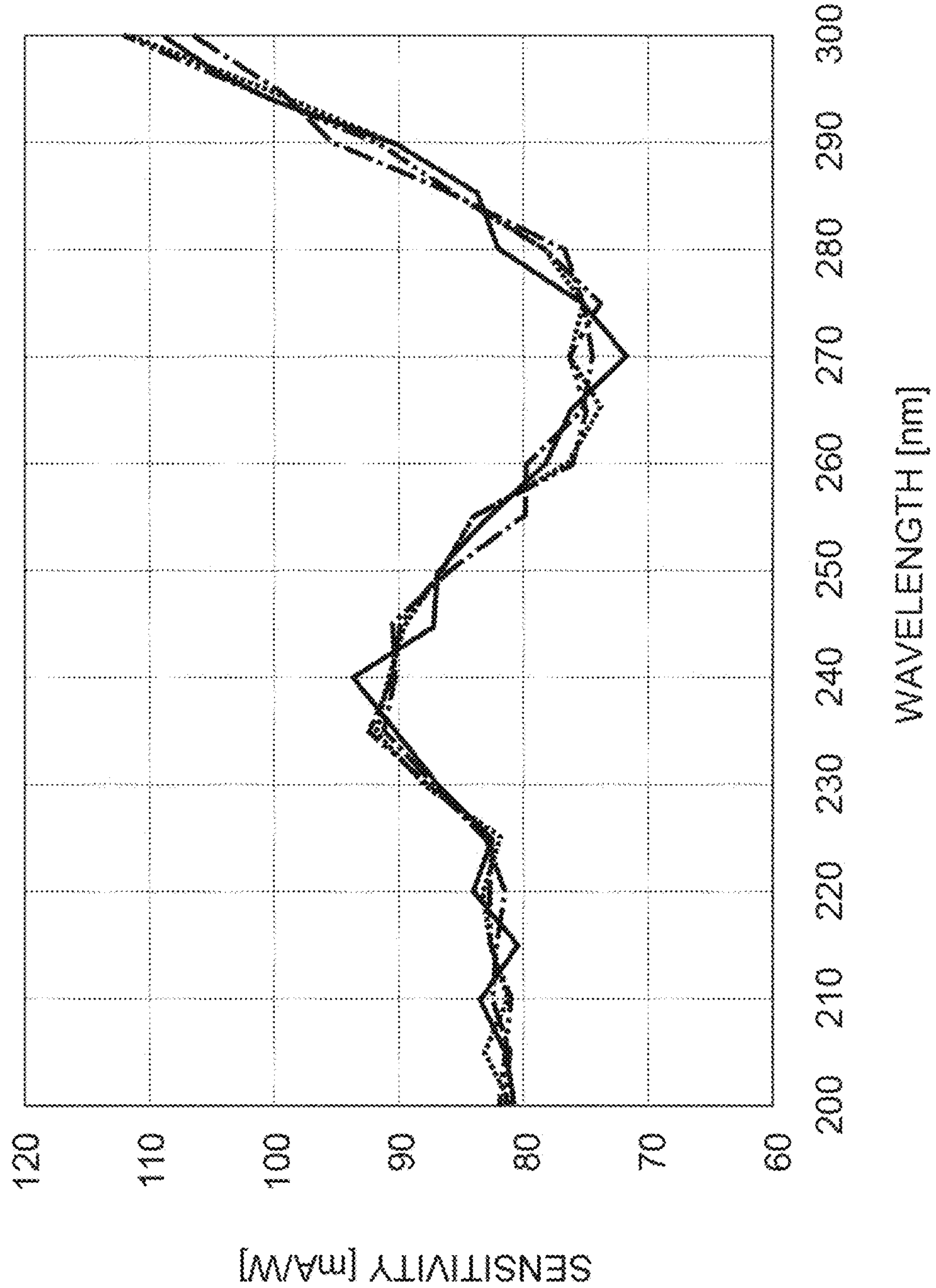
FIG. 19 is an enlarged graph showing spectral sensitivity characteristics in an ultraviolet range of the solid-state imaging device having the uneven portion of the pattern shown in FIG. 14.

FIGS. 18 and 19 are graphs showing spectral sensitivity characteristics of the solid-state imaging device having the uneven portion of the pattern shown in FIG. 14. FIG. 18 shows spectral sensitivity characteristics in a wide wavelength range including an ultraviolet range to a near infrared range and FIG. 19 shows spectral sensitivity characteristics in an ultraviolet range in an enlarged state. In FIGS. 18 and 19, the spectral sensitivity characteristics of four samples having the same configuration as the comparative example are superimposed and plotted as in the case of FIGS. 11 and 12. As shown in FIGS. 18 and 19, in the comparative example, the effect that the periods of a variation in spectral sensitivity with respect to the wavelength of the incident light cancel each other is unlikely to occur and it can be seen that the peaks and valleys occur in the spectral sensitivity profile as compared with the embodiment. Further, it can be seen that a variation in spectral sensitivity characteristics among the samples are larger than in the embodiment.

Figure 20:
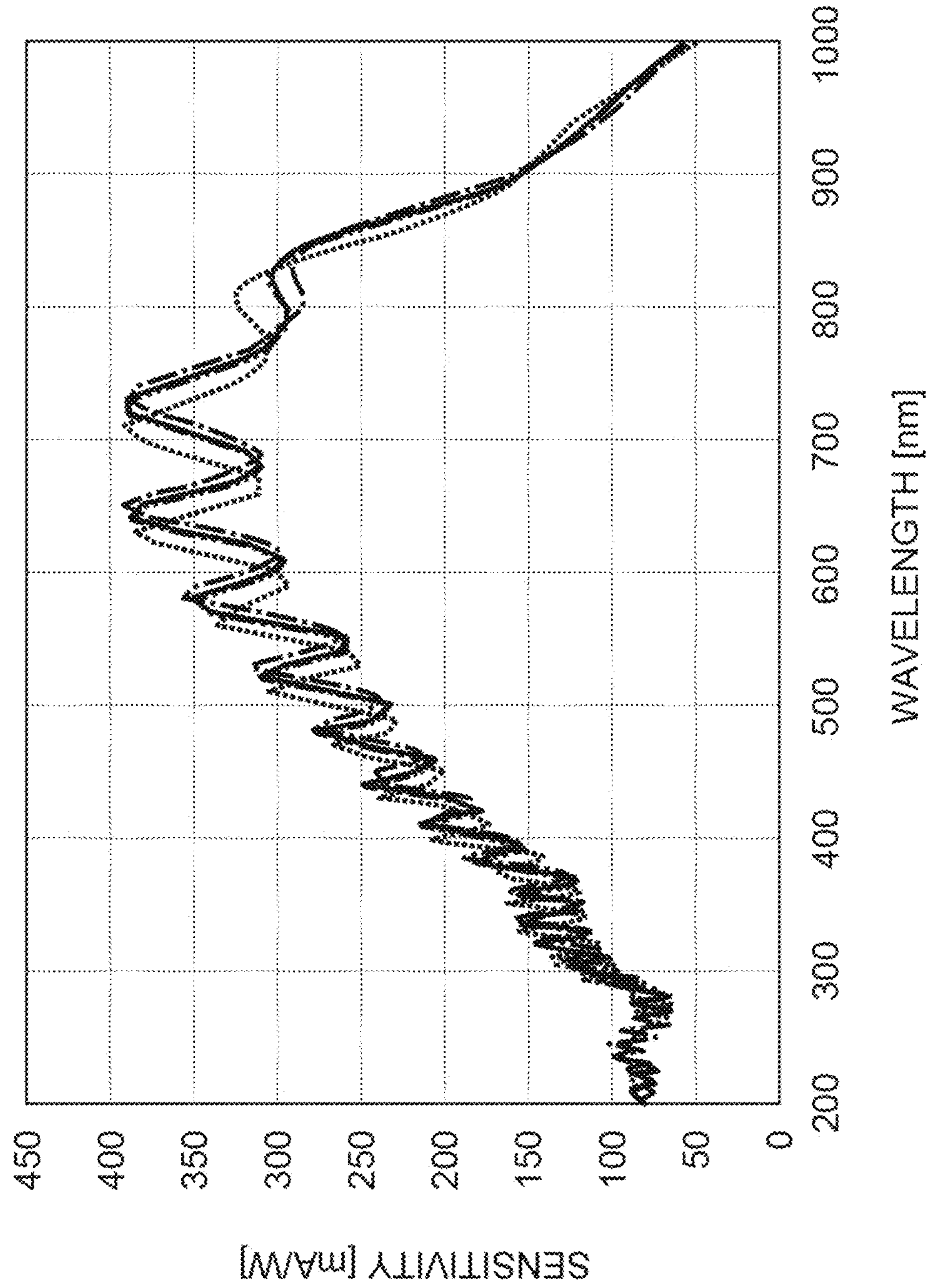
FIG. 20 is a graph showing spectral sensitivity characteristics in an ultraviolet range to a near infrared range of a solid-state imaging device without the uneven portion on the insulating film.
Figure 21:
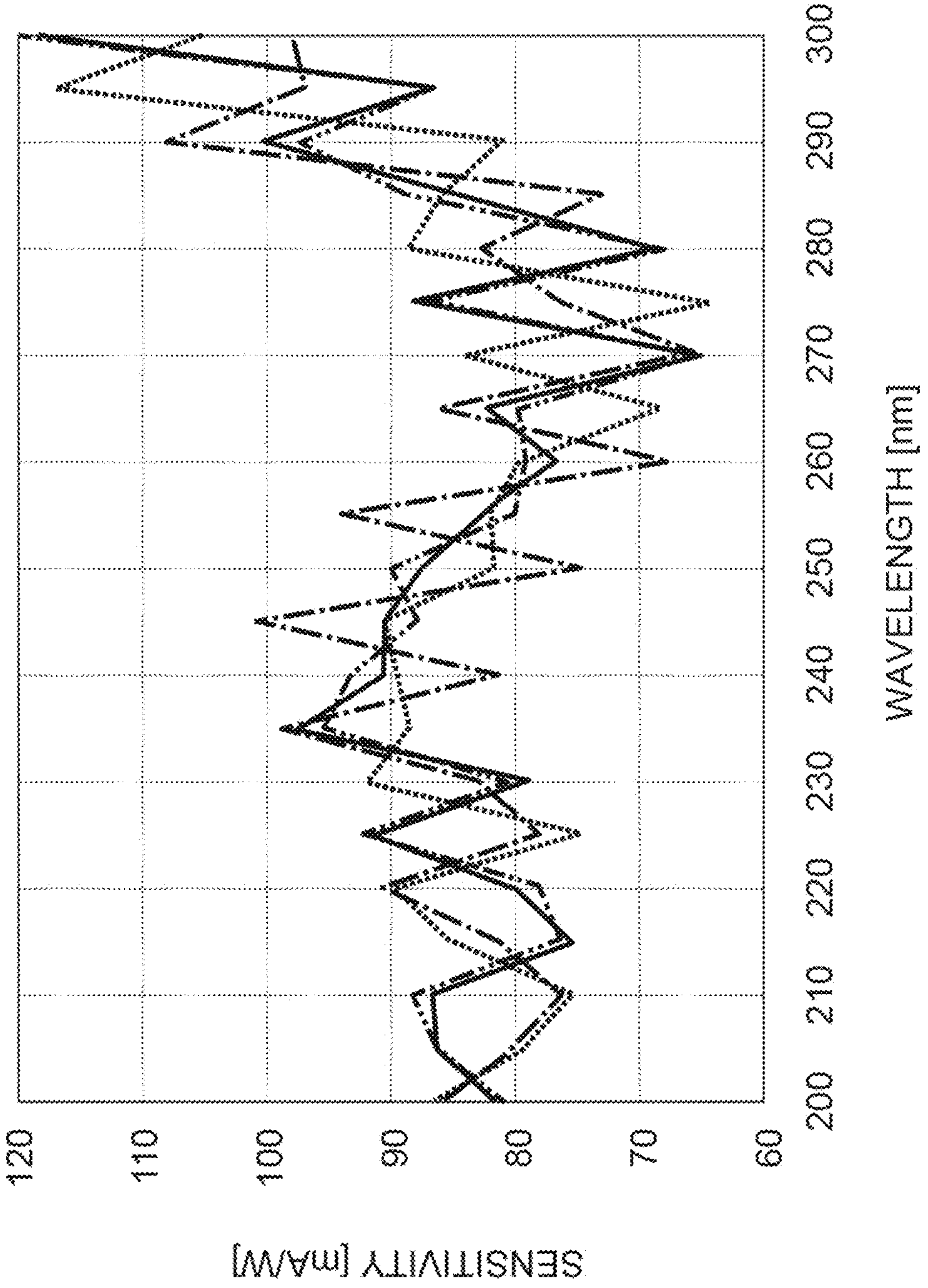
FIG. 21 is an enlarged graph showing spectral sensitivity characteristics in an ultraviolet range of the solid-state imaging device without the uneven portion on the insulating film.

Additionally, FIGS. 20 and 21 are graphs showing spectral sensitivity characteristics of a solid-state imaging device according to a reference example. In this reference example, spectral sensitivity characteristics of four samples of the configuration in which the uneven portion is not provided on the insulating film are superimposed and plotted. As shown in FIGS. 20 and 21, in the reference example, the effect that the periods of a variation in spectral sensitivity with respect to the wavelength of the incident light cancel each other is not achieved. Then, it can be seen that the spectral sensitivity profile has large peaks and valleys as compared with the comparative example and a variation in spectral sensitivity characteristics among the samples are further increased.

[Consideration of Uneven Portion of Insulating Film]

In the above-described embodiment, the maximum value of the appearance frequency of the surface height of the insulating film 30 based on the highest top portion of the insulating film 30 is 5% or less. When calculating the maximum value of the appearance frequency of the surface height of the insulating film 30, the relationship between the maximum value of the appearance frequency of the surface height of the insulating film 30 and the peaks and valleys of the spectral sensitivity was investigated. Here, in the peaks and valleys of the spectral sensitivity, the absolute value of the variation amount of the spectral sensitivity for each wavelength was taken as the average value over the entire wavelength range (200 nm to 1000 nm). The absolute value of the variation amount of the spectral sensitivity for each wavelength is a value calculated by $\Delta S/S\times 100(\%)$ when the average value of the spectral sensitivity at a certain wavelength is S and the difference between S and the maximum value or minimum value of the spectral sensitivity at a certain wavelength is $\Delta S$.

Figure 22:
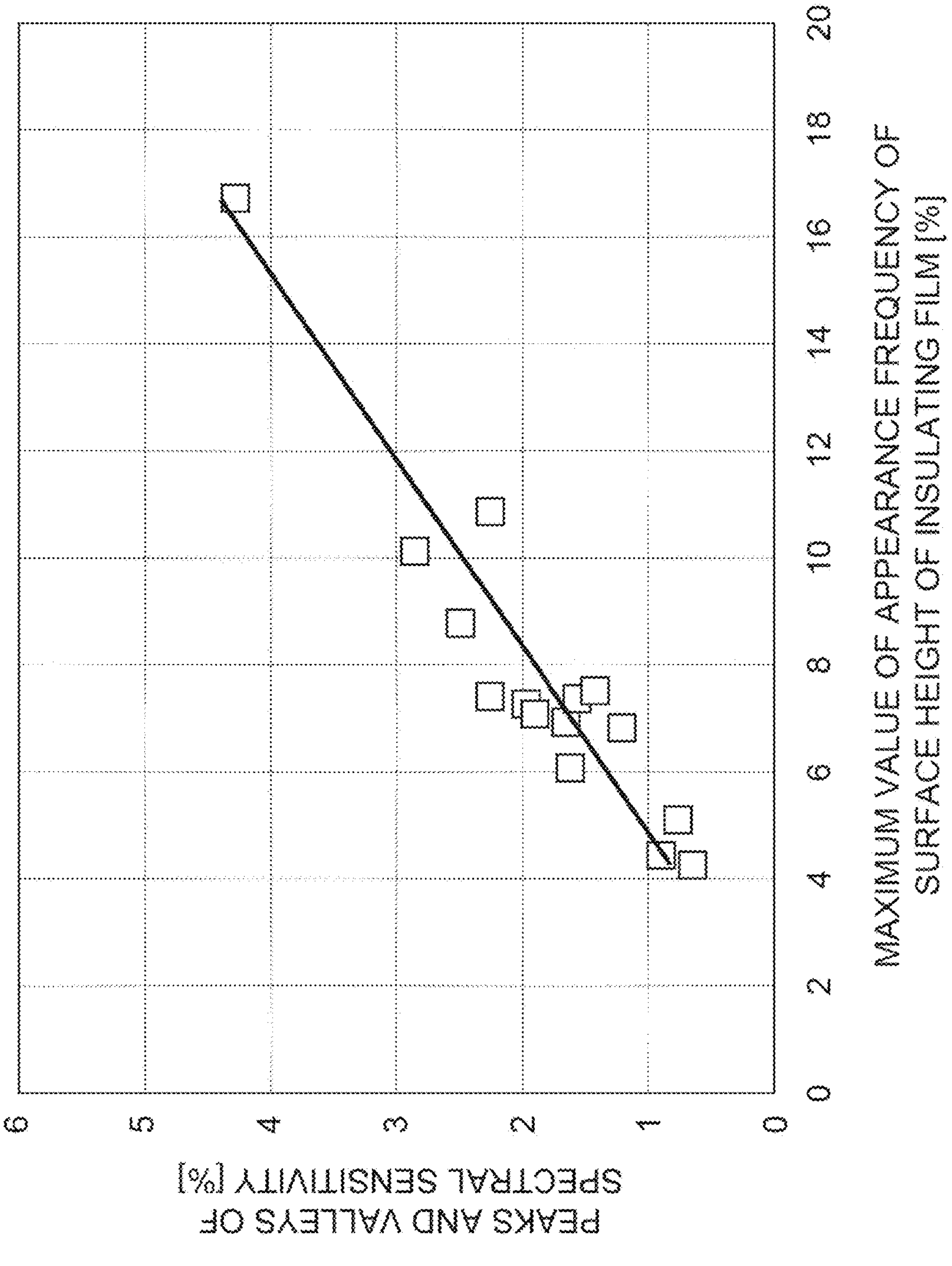
FIG. 22 is a graph showing a relationship between a maximum value of an appearance frequency of the surface height of the insulating film and peaks and valleys of spectral sensitivity.

FIG. 22 is a graph showing a relationship between the maximum value of the appearance frequency of the surface height of the insulating film and the peaks and valleys of the spectral sensitivity. In the same drawing, the horizontal axis indicates the maximum value of the appearance frequency of the surface height of the insulating film and the vertical axis indicates the peaks and valleys of the spectral sensitivity. As shown in FIG. 22, there is a certain correlation between the maximum value of the appearance frequency of the surface height of the insulating film and the peaks and valleys of the spectral sensitivity and it can be seen that the peaks and valleys of the spectral sensitivity become smaller as the maximum value of the appearance frequency of the surface height of the insulating film becomes smaller. From the result of FIG. 22, the peaks and valleys of the spectral sensitivity are suppressed to 1% or less in the range in which the maximum value of the appearance frequency of the surface height of the insulating film is 5% or less. Thus, it can be confirmed that a variation in spectral sensitivity is significantly reduced in a condition that the maximum value of the appearance frequency of the surface height of the insulating film is 5% or less.

Figure 23:
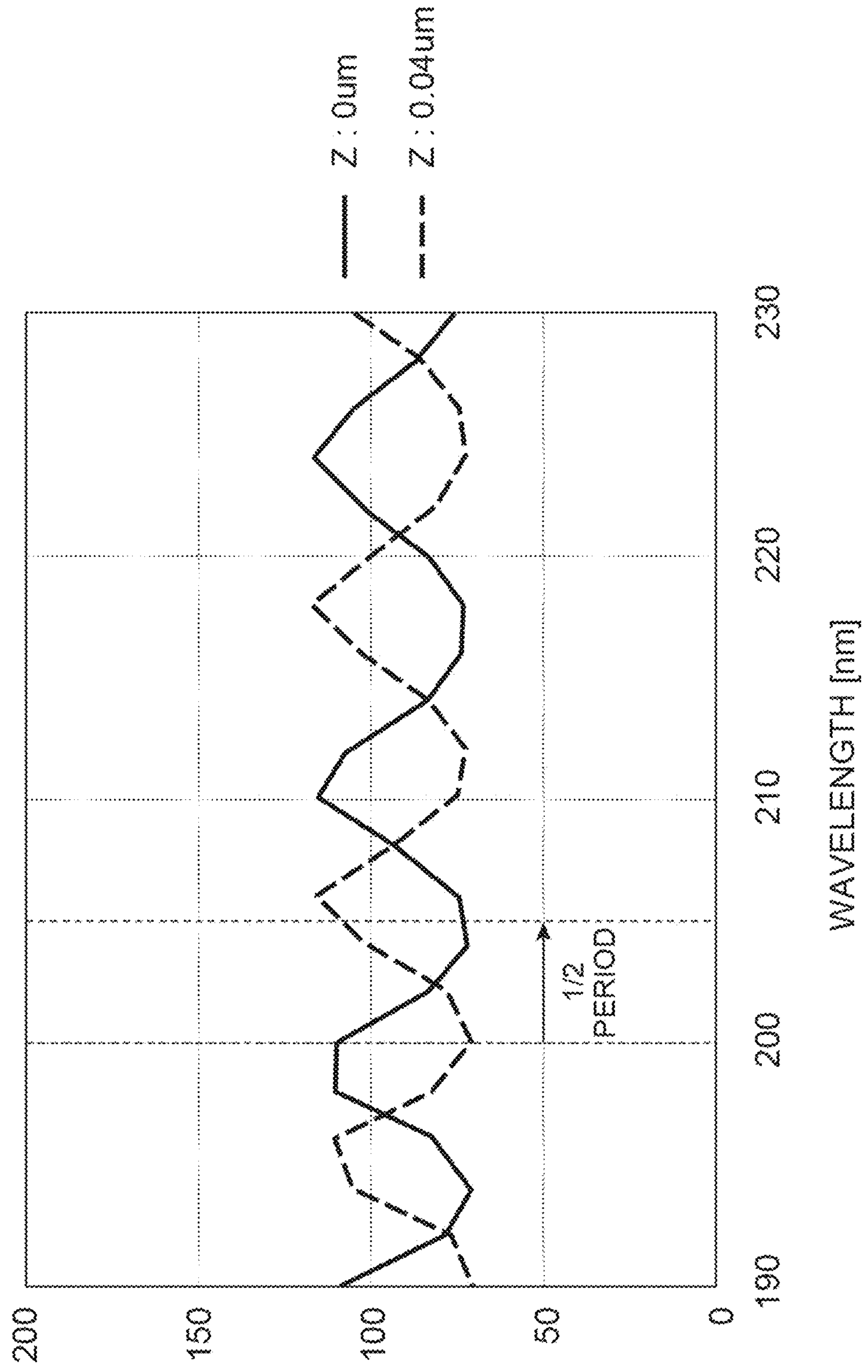
FIG. 23 is a graph showing a case in which the peaks and valleys of the spectral sensitivity shift.

The reason why the resolution of the depth when calculating the appearance frequency of the surface height of the insulating film is 0.01 μm is that the peaks and valleys of the spectral sensitivity are shifted by changing the height difference of the uneven portion. FIG. 23 is a graph showing a state in which the peaks and valleys of the spectral sensitivity are shifted. As shown in the same drawing, the peaks and valleys of the spectral sensitivity are reversed when the waveform of the spectral sensitivity is shifted by ½ period. For example, when the height difference of the uneven portion changes by 0.04 μm at the wavelength of 200 nm, the waveform of the spectral sensitivity is shifted by ½ period. Thus, it is possible to calculate the phenomenon in which the peaks and valleys of the spectral sensitivity are reversed as the appearance frequency by measuring the depth of the uneven portion at the resolution of 0.01 μm which is ¼ of 0.04 μm.

The wavelength of 200 nm is near the lower limit value of the measurement wavelength range of a general light receiving sensor. On the longer wavelength side, the height difference of the uneven portion required to shift the waveform of the spectral sensitivity by ½ period becomes a larger value. Thus, if the resolution of the depth when calculating the appearance frequency based on the wavelength of 200 nm is specified, the resolution is also sufficient for the solid-state imaging device that targets the incident light on the longer wavelength side.

Further, when the height difference of the uneven portion R is measured at the interval of 0.01 μm in the light sensitive region 3, the standard deviation of the appearance frequency of the surface height of the insulating film 30 based on the highest top portion of the insulating film 30 may be 1% or less. Even in this case, various height differences of the uneven portions R exist on the insulating film 30 and the effect that the periods of a variation in spectral sensitivity with respect to the wavelength of the incident light cancel each other can be improved. Thus, it is possible to more effectively reduce a variation in sensitivity in a wide wavelength range including, for example, an ultraviolet range to a near infrared range.

Figure 24:
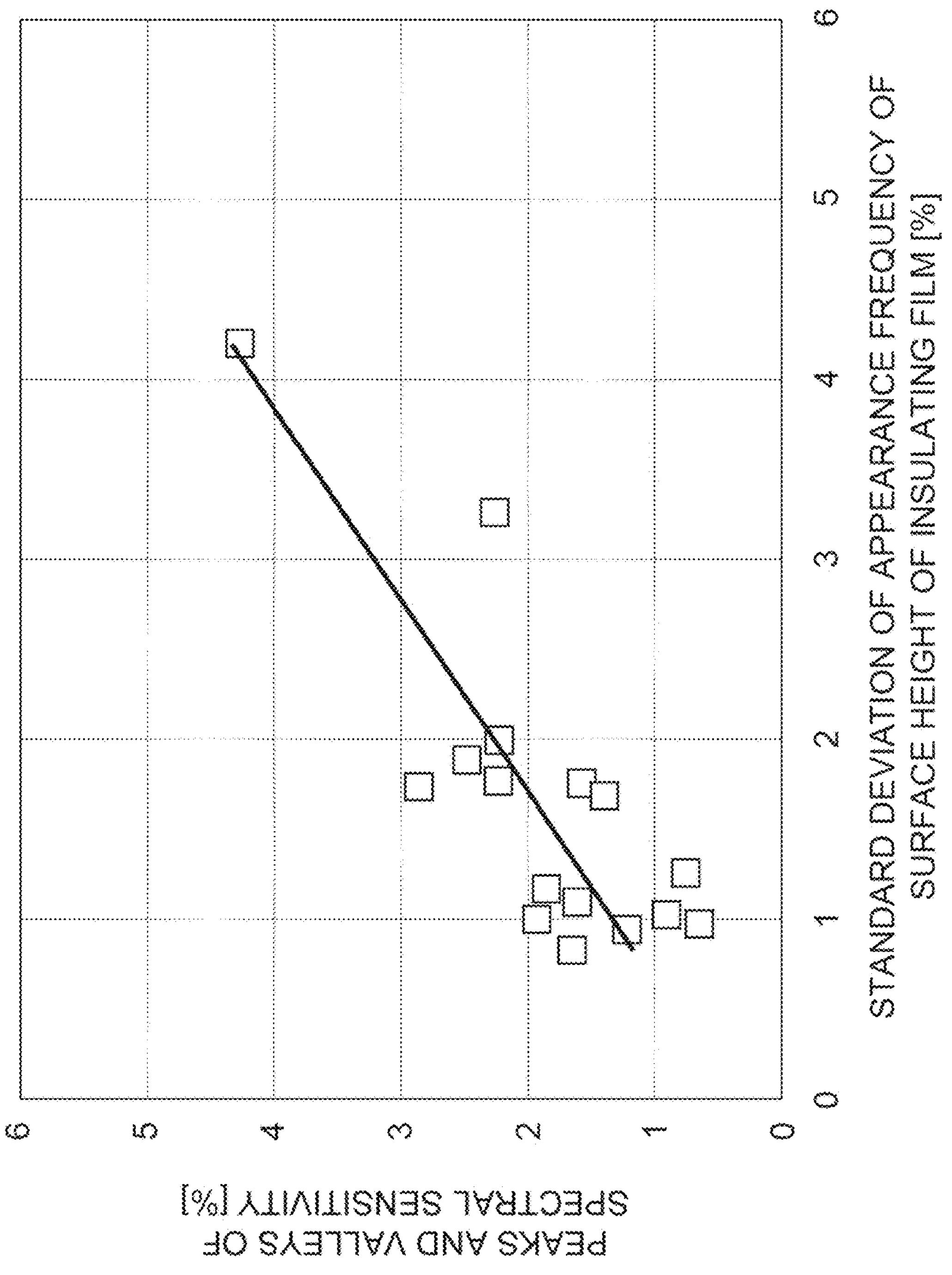
FIG. 24 is a graph showing a relationship between a standard deviation of the appearance frequency of the surface height of the insulating film and the peaks and valleys of the spectral sensitivity.

FIG. 24 is a graph showing a relationship between the standard deviation of the appearance frequency of the surface height of the insulating film and the peaks and valleys of the spectral sensitivity. In the same drawing, the horizontal axis indicates the standard deviation of the appearance frequency of the surface height of the insulating film and the vertical axis indicates the peaks and valleys of the spectral sensitivity. As shown in FIG. 24, there is a certain correlation between the standard deviation of the appearance frequency of the surface height of the insulating film and the peaks and valleys of the spectral sensitivity and it can be seen that the peaks and valleys of the spectral sensitivity become smaller as the standard deviation of the appearance frequency of the surface height of the insulating film becomes smaller. From the result of FIG. 24, the peaks and valleys of the spectral sensitivity are suppressed to 1% or less in the range in which the standard deviation of the appearance frequency of the surface height of the insulating film is 1% or less. Thus, it can be confirmed that a variation in spectral sensitivity is significantly reduced in a condition that the standard deviation of the appearance frequency of the surface height of the insulating film is 1% or less.

Figure 25:
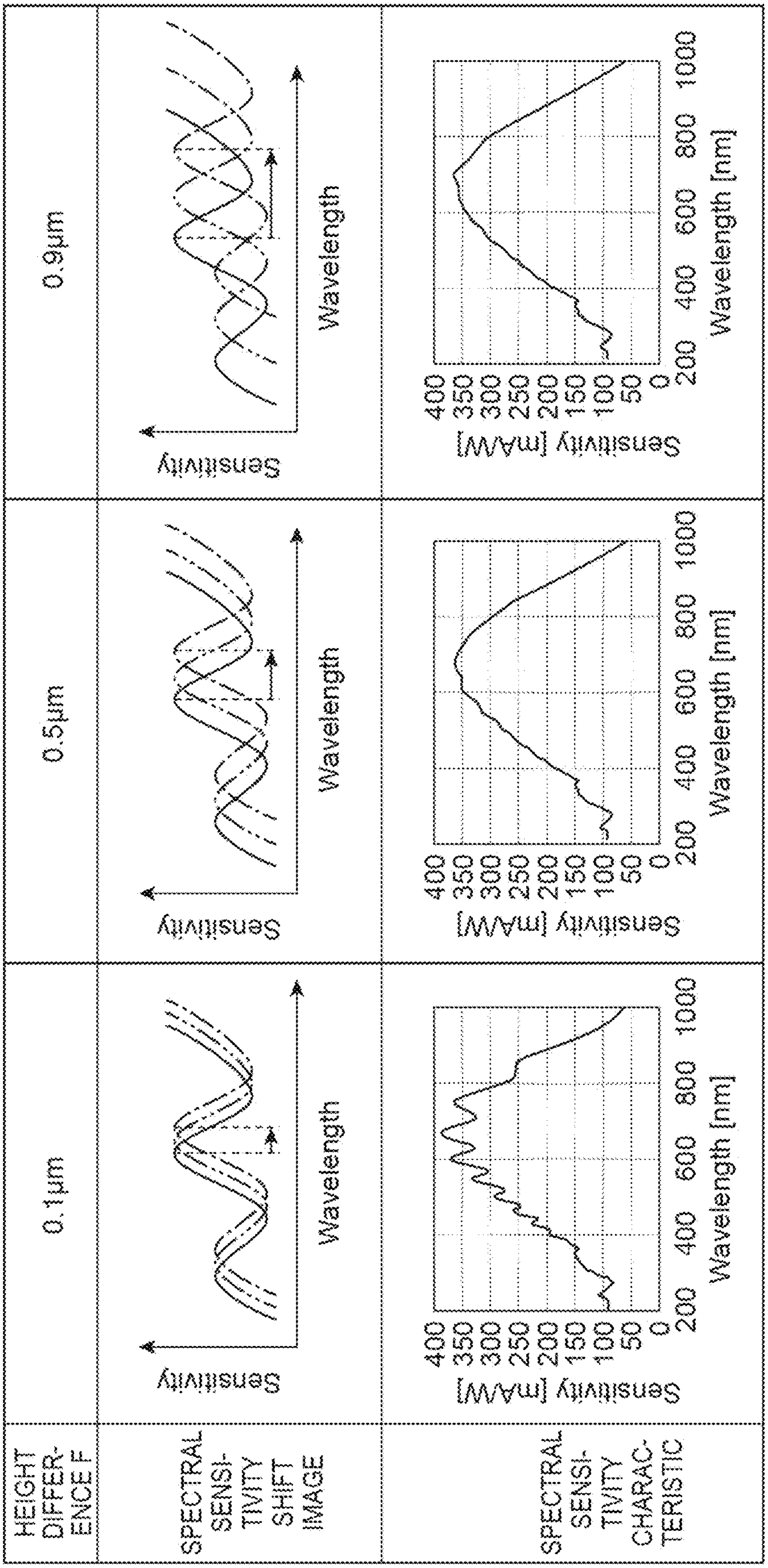
FIG. 25 is a diagram showing a behavior of the peaks and valleys of the spectral sensitivity when the height difference between the highest top portion and the lowest bottom portion of the uneven portion is changed.

Further, in the above-described embodiment, the height difference F (see FIG. 9) between the highest top portion and the lowest bottom portion of the uneven portion R is 0.5 μm or more and 0.9 μm or less. In this regard, FIG. 25 shows the behavior of the peaks and valleys of the spectral sensitivity when the height difference F is changed. As shown in the same drawing, since the optical path length difference of the incident light in the insulating film is small when the height difference F is 0.1 μm, the shift amount of the spectral sensitivity based on each optical path length difference becomes small. Thus, it is conceivable that the effect that the periods of a variation in spectral sensitivity cancel each other occurs only in a limited wavelength range. On the other hand, since the optical path length difference of the incident light in the insulating film becomes sufficiently large when the height difference F is 0.5 μm and 0.9 μm, the shift amount of the spectral sensitivity based on each optical path length difference becomes large. Thus, the effect that the periods of a variation in spectral sensitivity with respect to the wavelength of the incident light cancel each other is improved and the peaks and valleys of the spectral sensitivity can be further decreased.

When the height difference F exceeds 0.9 μm, the optical path length difference of the incident light in the insulating film becomes larger. On the other hand, it is conceivable that the depth of the concave portion becomes excessive and the absolute value of the spectral sensitivity changes due to the refraction and reflection of the incident light on the surface of the insulating film. Thus, it is possible to reduce a variation in sensitivity in a wide wavelength range including, for example, an ultraviolet range to a near infrared range without causing a problem of a change in the absolute value of the spectral sensitivity in the range in which the height difference F is 0.5 μm or more and 0.9 μm or less.

Figure 26:
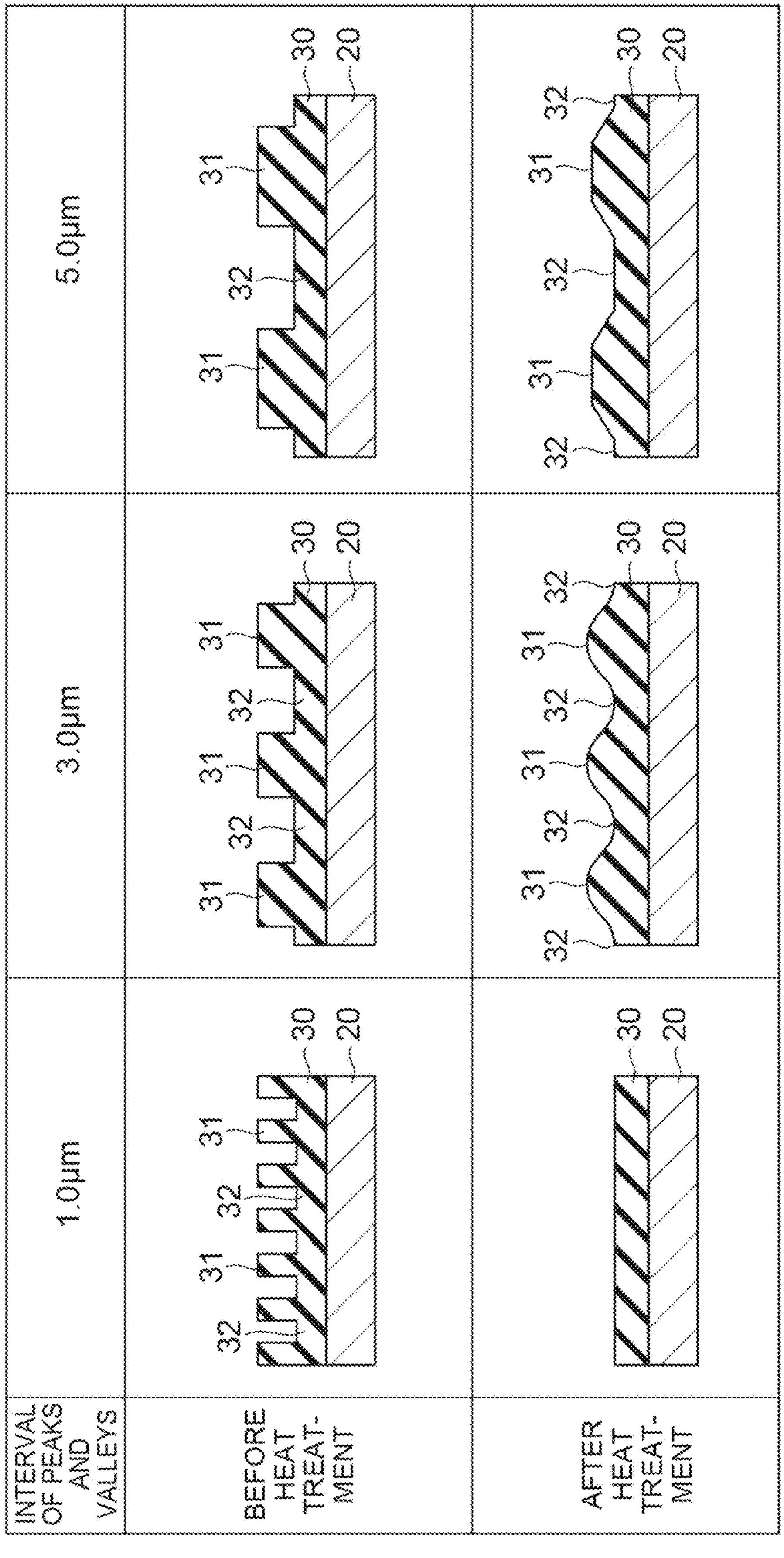
FIG. 26 is a schematic cross-sectional view showing a state of a change in uneven portion before and after heat treatment.

It is preferable that the interval of the uneven portion R before the heat treatment is 2 μm to 4 μm. As shown in FIG. 26, when the interval of the uneven portion R before the heat treatment is 1.0 μm (here, both the width of the convex portion 31 and the width of the concave portion 32 are 1.0 μm), the flow amount of the insulating film 30 from the convex portion 31 to the concave portion 32 during the heat treatment becomes excessive. As a result, the main surface 30*b* of the insulating film 30 after the heat treatment tends to be a flat surface. When the interval of the uneven portion R before the heat treatment is 3.0 μm (here, both the width of the convex portion 31 and the width of the concave portion 32 are 3.0 μm), the flow amount of the insulating film 30 from the convex portion 31 to the concave portion 32 during the heat treatment becomes appropriate. As a result, when the main surface 30*b* of the insulating film 30 after the heat treatment waves in a sinusoidal shape, the uneven portion R shown in FIGS. 3 and 4 is formed.

On the other hand, when the interval of the uneven portion R before the heat treatment is 5.0 μm (here, both the width of the convex portion 31 and the width of the concave portion 32 are 5.0 μm), the flow amount of the insulating film 30 from the convex portion 31 to the concave portion 32 during the heat treatment becomes insufficient. As a result, the uneven portion occurs in the insulating film 30 after the heat treatment, but a flat portion tends to remain on the top portion 31*a* of the convex portion 31 or the bottom portion 32*a* of the concave portion 32. In this case, it is conceivable that the appearance frequency of each height difference of the uneven portion R tends to be biased to a specific value. Thus, since the interval of the uneven portion R before the heat treatment is 2 μm to 4 μm as described above, various height differences of the uneven portions R tend to exist on the insulating film 30. Additionally, the flow amount of the insulating film 30 from the convex portion 31 to the concave portion 32 during the heat treatment changes depending on the temperature during the heat treatment or the concentration of impurities in the insulating film 30. However, it is conceivable that the appropriate range of the interval of the uneven portion R can be generalized as long as the heat treatment uses the manufacturing process of the general solid-state imaging device.

[Modified Example of Uneven Portion of Insulating Film]

Figure 27:
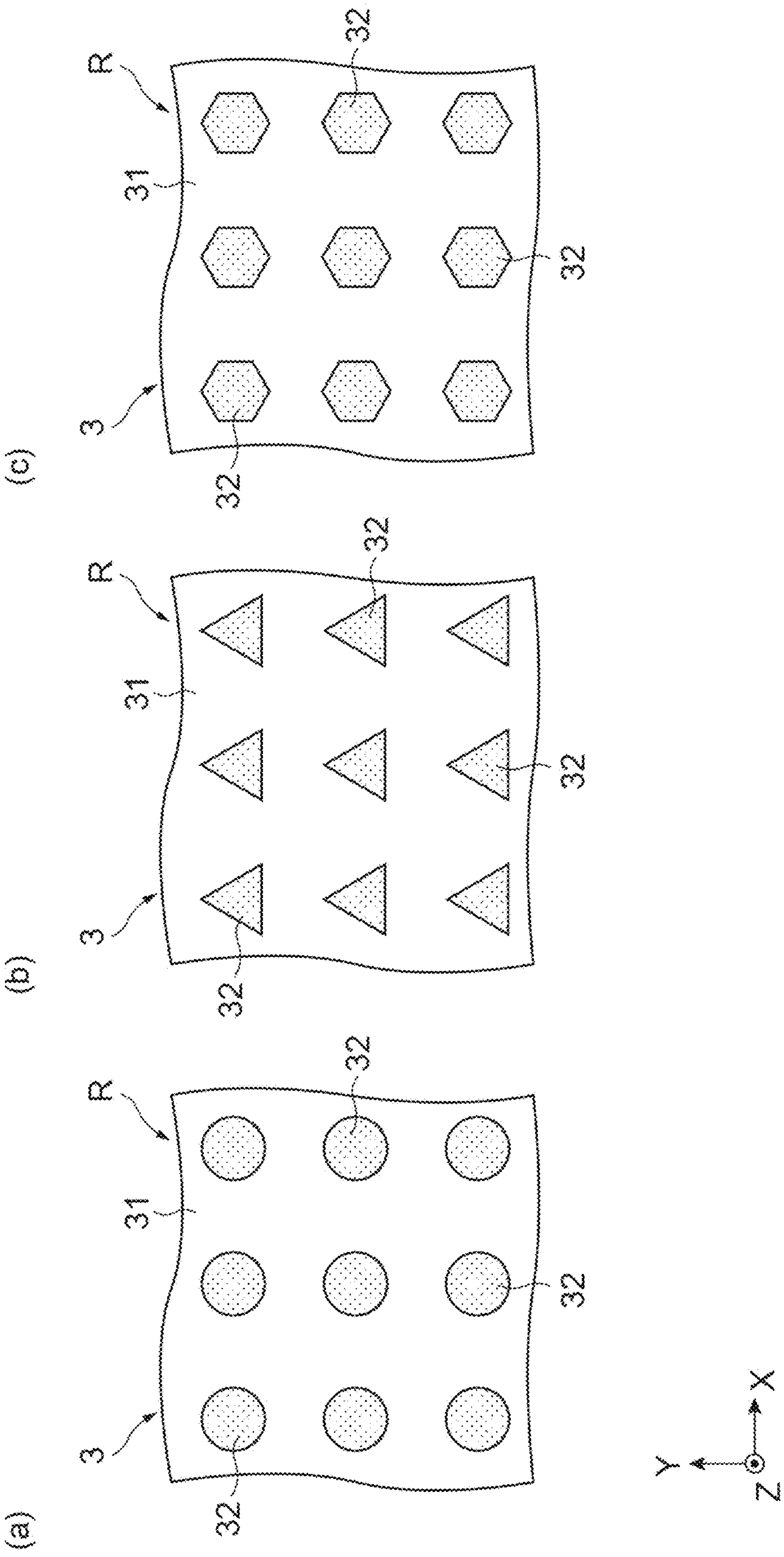
FIG. 27 is a main enlarged view showing a modified example of the pattern of the uneven portion of the insulating film.

Various modifications can be applied to the uneven portion R of the insulating film 30. For example, in FIGS. 3 and 4, the concave portions 32 having a substantially square shape in a plan view are arranged in a matrix in the in-plan direction of the main surface 30*b* of the insulating film 30, but as shown in FIG. 27(*a*), the concave portions 32 having a substantially circular shape in a plan view may be arranged in a matrix in the in-plane direction of the main surface 30*b* of the insulating film 30. Further, as shown in FIG. 27(*b*), the concave portions 32 having a substantially triangular shape in a plan view may be arranged in a matrix in the in-plane direction of the main surface 30*b* of the insulating film 30 and as shown in FIG. 27(*c*), the concave portions 32 having a substantially regular hexagonal shape in a plan view may be arranged in a matrix in the in-plane direction of the main surface 30*b* of the insulating film 30.

Figure 28:
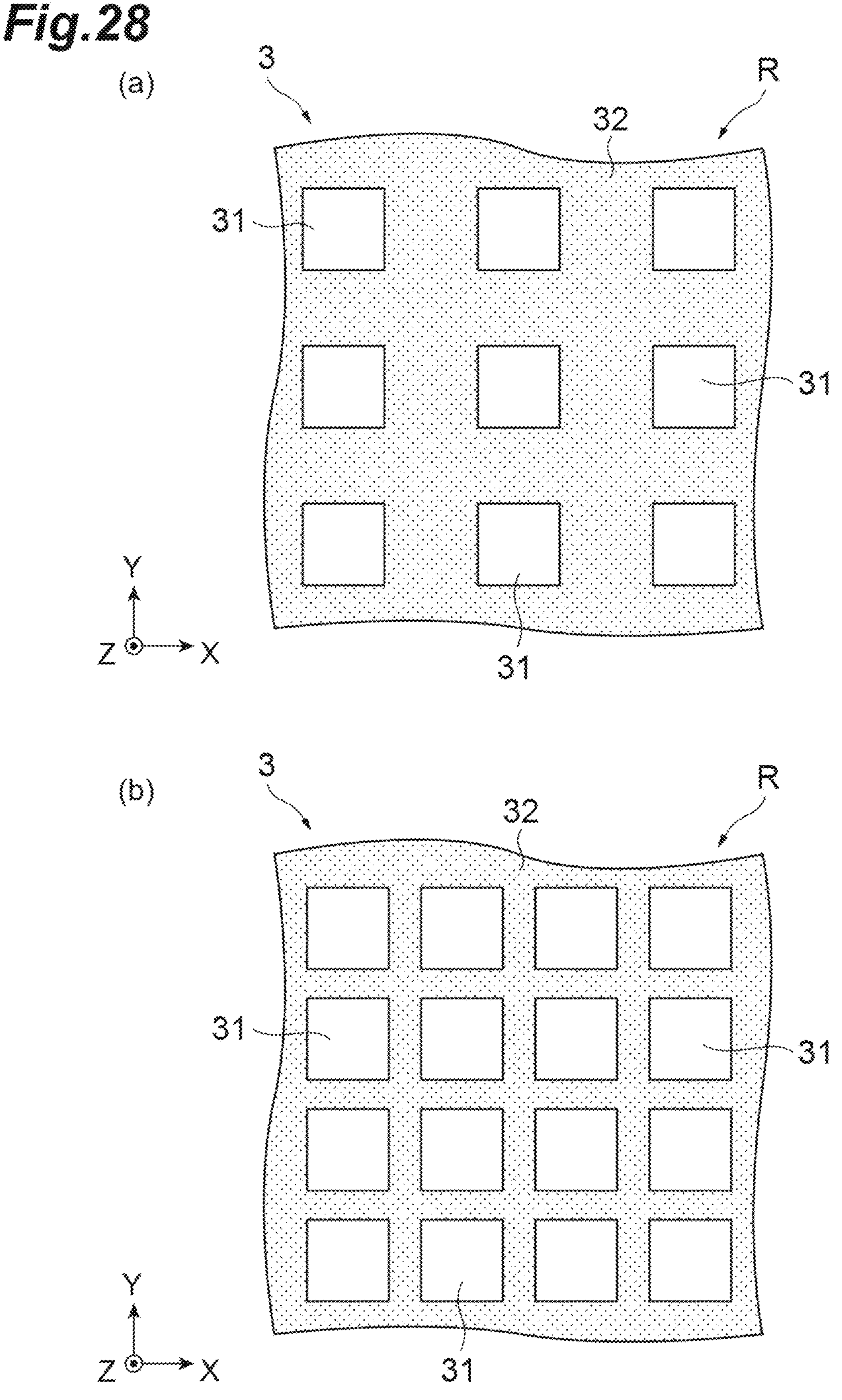
FIG. 28 is a main enlarged view showing another modified example of the pattern of the uneven portion of the insulating film.

Further, as shown in FIG. 28(*a*), the formation positions of the convex portion 31 and the concave portion 32 may be reversed with respect to the configurations of FIGS. 3 and 4. That is, the convex portions 31 having a square shape in a plan view may be arranged in a matrix in the in-plane direction of the main surface 30*b* of the insulating film 30. In this case, it is conceivable that the flow amount of the insulating film 30 during the heat treatment is insufficient when the pitch between the convex portions 31 and 31 is large. Here, as shown in FIG. 28(*b*), it is also preferable to ensure the area of the convex portion 31 with respect to the light sensitive region 3 by decreasing the pitch of the convex portions 31 and 31 while keeping the area of the convex portion 31.

Figure 29:
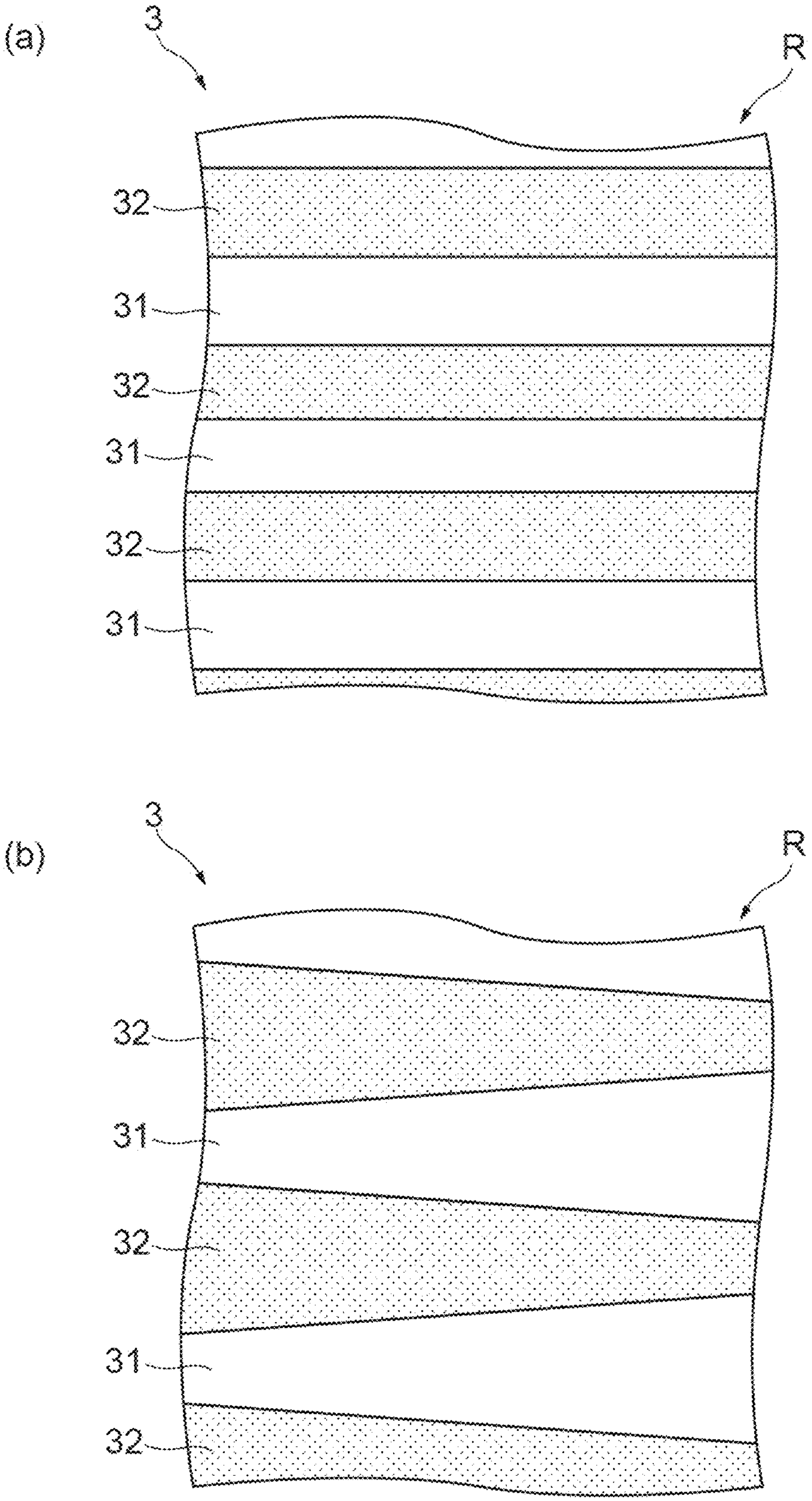
FIG. 29 is a main enlarged view showing another modified example of the uneven portion of the insulating film.

Further, the pattern of the uneven portion R of the insulating film 30 does not necessarily have to be a two-dimensional pattern, and the uneven portion R of the one-dimensional pattern can also be adopted. For example, in the example of FIG. 29(*a*), the uneven portion R includes the convex portion 31 extending in a band shape in the X direction and the concave portion 32 extending in a band shape in the Y direction in a plan view and the convex portion 31 and the concave portion 32 are alternately arranged in the Y direction. In the example of FIG. 29(*a*), a pair of the convex portion 31 and the concave portion 32 having a width of 3.0 μm in the Y direction and a pair of the convex portion 31 and the concave portion 32 having a width of 2.5 μm in the Y direction are alternately arranged in the Y direction as not in the comparative example shown in FIGS. 13 and 14.

Further, as shown in FIG. 29(*b*), in the uneven portion R of the one-dimensional pattern, the width of the convex portion 31 and the concave portion 32 in the Y direction may be changed in the X direction. In the example of FIG. 29(*b*), the width of the convex portion 31 in the Y direction gradually increases from 2.5 μm to 3.5 μm in the X direction. In contrast, the width of the concave portion 32 in the Y direction gradually decreases from 3.5 μm to 2.5 μm in the X direction.

Even in these embodiments, since a plurality of height differences exist in the uneven portion R provided on the side of the main surface 30*b* of the insulating film 30, a plurality of interferences having different optical path lengths occur in the insulating film 30 when the incident light is incident to the light sensitive region 3. Accordingly, since the periods of a variation in spectral sensitivity with respect to the wavelength of the incident light cancel each other, it is possible to reduce a variation in sensitivity in a wide wavelength range including, for example, an ultraviolet range to a near infrared range.

Figure 30:
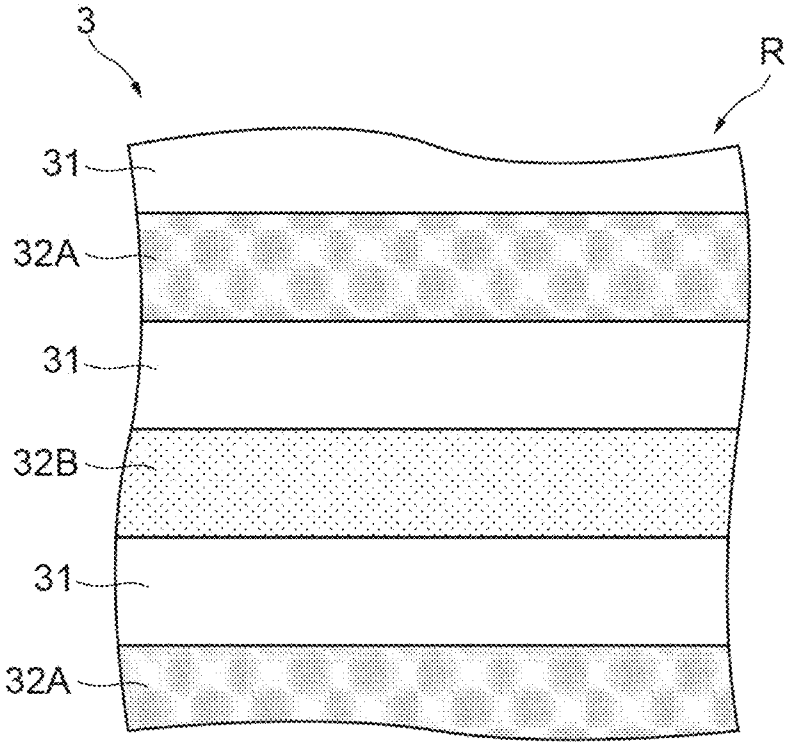
FIG. 30 is a main enlarged view showing another modified example of the pattern of the uneven portion of the insulating film.

Further, as shown in FIG. 30, the height position of the bottom portion 32*a* of the concave portion 32 may be different in the uneven portion R of the one-dimensional pattern. In the example of FIG. 30, the width of the convex portion 31 and the concave portion 32 in the Y direction is 3.0 μm. Further, a concave portion A in which the height position of the bottom portion 32*a* is relatively low and a concave portion 32B in which the height position of the bottom portion 32*a* is relatively high are alternately arranged with the convex portion 31 interposed therebetween. In this case, since the height position of the concave portion 32 is not uniform, a plurality of height differences can exist in the uneven portion R even when the convex portion 31 and the concave portion 32 are arranged at an equal pitch in the Y direction. The concave portions 32A and 32B having different height positions of the bottom portions 32*a* can be easily manufactured by changing, for example, a dry etching amount of the insulating film 30 before the heat treatment. In the embodiment of FIGS. 29 and 30, it is possible to suppress crosstalk to adjacent pixels due to refraction at the interface between the convex portion 31 and the concave portion 32. Further, it is possible to easily form the uneven portion R even when the pitch of the light sensitive region 3 in the X direction becomes small.

Figure 31:
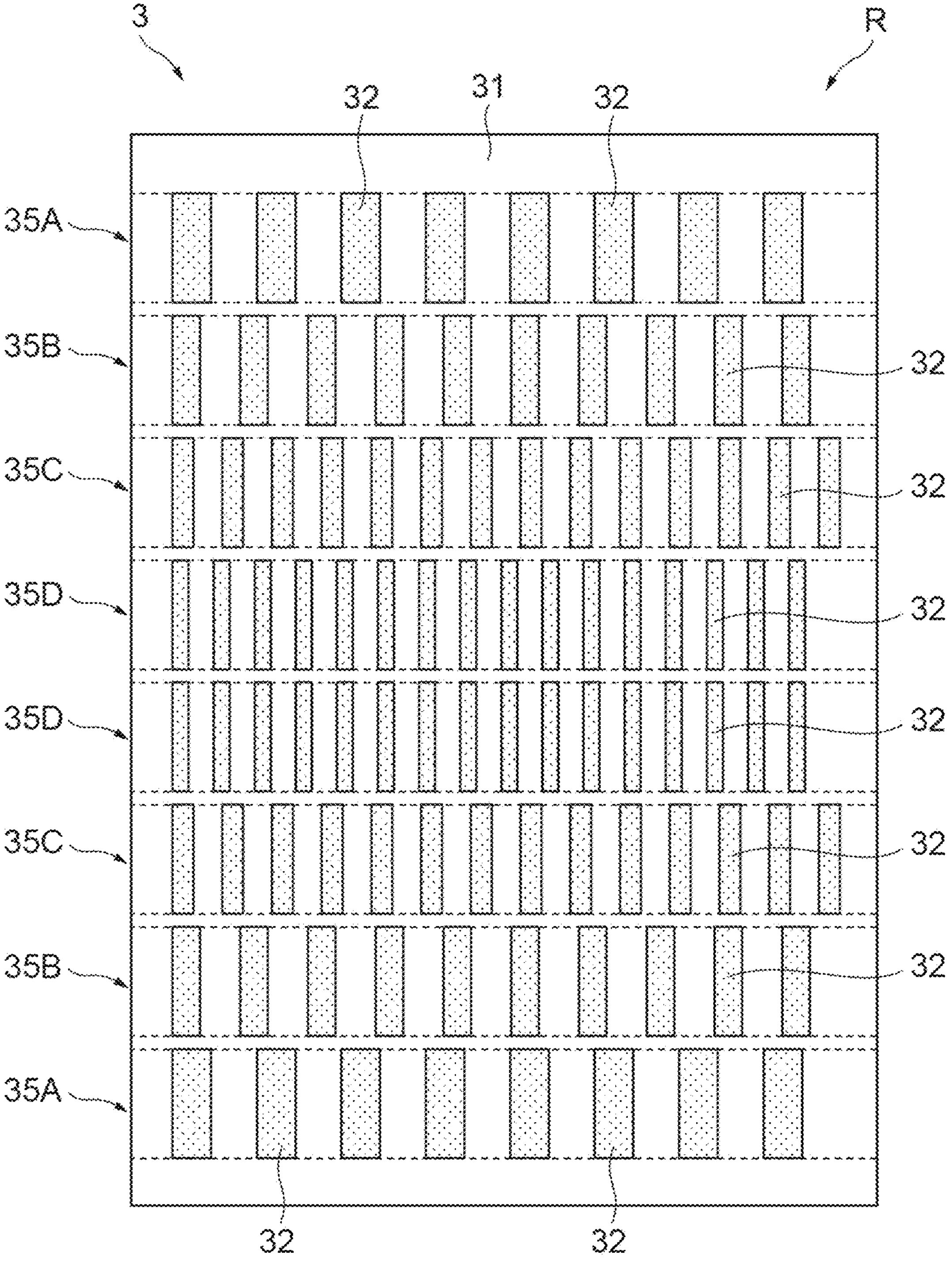
FIG. 31 is a main enlarged view showing another modified example of the pattern of the uneven portion of the insulating film.

In the example of FIGS. 29 and 30, the uneven portions of the one-dimensional pattern are arranged in the Y direction, but as shown in FIG. 31, the uneven portions R of the one-dimensional pattern may be arranged in the X direction. In the example of FIG. 31, the uneven portion R is formed by an uneven portion row 35A in which the convex portion 31 and the concave portion 32 having a width of 3.0 μm in the X direction are arranged in the X direction, an uneven portion row 35B in which the convex portion 31 and the concave portion 32 having a width of 2.5 μm in the X direction are arranged in the X direction, an uneven portion row 35C in which the convex portion 31 and the concave portion 32 having a width of 2.0 μm in the X direction are arranged in the X direction, and an uneven portion row 35D in which the convex portion 31 and the concave portion 32 having a width of 1.5 μm in the X direction are arranged in the X direction. In the Y direction, the uneven portion row 35A to the uneven portion row 35D are sequentially arranged from both ends of the light sensitive region 3 and the uneven portion rows 35D are adjacent to each other at the center. The convex portion 31 is disposed between the uneven portion rows 35A to 35D with a width of 1 μm.

Even in these embodiments, since the plurality of height differences exist in the uneven portion R provided on the side of the main surface 30*b* of the insulating film 30, a plurality of interferences having different optical path lengths occur in the insulating film 30 when the incident light is incident to the light sensitive region 3. Accordingly, since the periods of a variation in spectral sensitivity with respect to the wavelength of the incident light cancel each other, it is possible to reduce a variation in sensitivity in a wide wavelength range including, for example, an ultraviolet range to a near infrared range.

REFERENCE SIGNS LIST

1: solid-state imaging device, 3: light sensitive region, 20: semiconductor substrate, 20*a*: main surface, 30: insulating film, 30*b*: main surface, R: uneven portion.

The invention claimed is:

1. A solid-state imaging device comprising:

a semiconductor substrate having a main surface provided with a plurality of light sensitive regions; and an insulating film provided on the main surface of the semiconductor substrate, wherein a plurality of gently continuous uneven portions are formed on a surface on the side opposite to the main surface of the semiconductor substrate in the insulating film, and wherein a height difference referring to a thickness difference between a bottom portion and a top portion of the uneven portions exists in the plurality of light sensitive regions, the uneven portions having a plurality of height differences within one of the plurality of light sensitive regions, the plurality of height differences including a first height difference and a second height difference, both present in a same direction, the first height difference being different from the second height difference.

2. The solid-state imaging device according to claim 1, wherein when the height difference of the uneven portion is measured at an interval of 0.01 μm in the light sensitive region, a maximum value of an appearance frequency of a surface height of the insulating film based on the highest top portion of the insulating film is 5% or less.

3. The solid-state imaging device according to claim 1, wherein when the height difference of the uneven portion is measured at an interval of 0.01 μm in the light sensitive region, a standard deviation of an appearance frequency of a surface height of the insulating film based on the highest top portion of the insulating film is 1% or less.

4. The solid-state imaging device according to claim 1, wherein the height difference between the highest top portion and the lowest bottom portion of the uneven portion in the light sensitive region is 0.5 μm or more and 0.9 μm or less.

5. The solid-state imaging device according to claim 1, wherein the main surface of the semiconductor substrate is a flat surface.

* * * * *